US010160824B2

(12) United States Patent
Katagiri et al.

(10) Patent No.: US 10,160,824 B2
(45) Date of Patent: Dec. 25, 2018

(54) CYANATE ESTER COMPOUND, CURABLE RESIN COMPOSITION CONTAINING SAID COMPOUND, AND CURED PRODUCT OF SAID COMPOSITION

(71) Applicant: MITSUBISHI GAS CHEMICAL COMPANY, INC., Tokyo (JP)

(72) Inventors: Masayuki Katagiri, Niigata (JP); Go Higashihara, Okayama (JP); Kenji Arii, Okayama (JP); Yuuichi Sugano, Niigata (JP); Makoto Tsubuku, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 319 days.

(21) Appl. No.: 14/784,128

(22) PCT Filed: Jun. 16, 2014

(86) PCT No.: PCT/JP2014/065938
§ 371 (c)(1),
(2) Date: Oct. 13, 2015

(87) PCT Pub. No.: WO2014/203865
PCT Pub. Date: Dec. 24, 2014

(65) Prior Publication Data
US 2016/0115271 A1    Apr. 28, 2016

(30) Foreign Application Priority Data

Jun. 18, 2013 (JP) .................................. 2013-127436
Dec. 25, 2013 (JP) .................................. 2013-266948

(51) Int. Cl.

| | |
|---|---|
| *C08G 10/04* | (2006.01) |
| *C08J 5/24* | (2006.01) |
| *C08G 14/12* | (2006.01) |
| *C09D 161/34* | (2006.01) |
| *C09D 179/04* | (2006.01) |
| *C08G 73/06* | (2006.01) |
| *C09J 161/34* | (2006.01) |
| *C09J 179/04* | (2006.01) |
| *C08L 61/34* | (2006.01) |
| *C08L 79/04* | (2006.01) |
| *B32B 7/12* | (2006.01) |
| *B32B 15/14* | (2006.01) |
| *B32B 15/08* | (2006.01) |
| *B32B 27/28* | (2006.01) |
| *C08L 61/18* | (2006.01) |
| *C08L 63/00* | (2006.01) |
| *C08L 71/00* | (2006.01) |
| *C09D 161/18* | (2006.01) |
| *C09J 161/18* | (2006.01) |
| *H05K 1/03* | (2006.01) |

(52) U.S. Cl.
CPC ............... *C08G 10/04* (2013.01); *B32B 7/12* (2013.01); *B32B 15/08* (2013.01); *B32B 15/14* (2013.01); *B32B 27/28* (2013.01); *C08G 14/12* (2013.01); *C08G 73/0655* (2013.01); *C08J 5/24* (2013.01); *C08L 61/18* (2013.01); *C08L 61/34* (2013.01); *C08L 63/00* (2013.01); *C08L 71/00* (2013.01); *C08L 79/04* (2013.01); *C09D 161/18* (2013.01); *C09D 161/34* (2013.01); *C09D 179/04* (2013.01); *C09J 161/18* (2013.01); *C09J 161/34* (2013.01); *C09J 179/04* (2013.01); *B32B 2260/021* (2013.01); *B32B 2260/046* (2013.01); *B32B 2307/3065* (2013.01); *B32B 2457/00* (2013.01); *C08J 2361/34* (2013.01); *C08J 2379/04* (2013.01); *H05K 1/0326* (2013.01); *H05K 1/0346* (2013.01)

(58) Field of Classification Search
CPC .......... C08L 61/34; H01B 3/307; C08G 10/04
See application file for complete search history.

(56) References Cited

U.S. PATENT DOCUMENTS

| | | | | |
|---|---|---|---|---|
| 5,109,078 | A * | 4/1992 | Das ....................... | C08G 8/00 428/422.8 |
| 5,264,500 | A | 11/1993 | Green et al. | |
| 7,528,220 | B2 * | 5/2009 | Sugano ................ | C07C 261/02 428/463 |
| 8,592,134 | B2 * | 11/2013 | Oguro .................... | G03F 7/094 430/270.1 |
| 2005/0182203 | A1 | 8/2005 | Sugano et al. | |
| 2006/0084787 | A1 | 4/2006 | Sugano et al. | |
| 2010/0316950 | A1 | 12/2010 | Oguro et al. | |
| 2010/0324255 | A1 | 12/2010 | Kita et al. | |
| 2011/0009574 | A1 | 1/2011 | Kita et al. | |
| 2011/0224333 | A1 | 9/2011 | Kitagawa et al. | |
| 2012/0238775 | A1 | 9/2012 | Kita et al. | |
| 2012/0238781 | A1 | 9/2012 | Kita et al. | |

(Continued)

FOREIGN PATENT DOCUMENTS

| | | |
|---|---|---|
| CN | 101889247 A | 11/2010 |
| JP | 1997-052941 A | 2/1997 |

(Continued)

OTHER PUBLICATIONS

International Search Report issued in Patent Application No. PCT/JP2014/065938, dated Jul. 15, 2014.

*Primary Examiner* — Gregory Listvoyb
(74) *Attorney, Agent, or Firm* — Greenblum & Bernstein, P.L.C.

(57) ABSTRACT

The cyanate ester compound of the present invention is obtained by cyanating a modified naphthalene formaldehyde resin.

9 Claims, 6 Drawing Sheets

(56) References Cited

U.S. PATENT DOCUMENTS

| | | |
|---|---|---|
| 2013/0281640 A1 | 10/2013 | Tsubuku et al. |
| 2014/0113518 A1 | 4/2014 | Arii et al. |
| 2014/0329066 A1 | 11/2014 | Saito et al. |
| 2015/0018499 A1 | 1/2015 | Uchiyama et al. |
| 2015/0034436 A1 | 2/2015 | Uchiyama |
| 2015/0037736 A1 | 2/2015 | Uchiyama |
| 2016/0125972 A1 | 5/2016 | Arii et al. |

FOREIGN PATENT DOCUMENTS

| | | |
|---|---|---|
| JP | 2005-097524 | 4/2005 |
| JP | 2005-264154 A | 9/2005 |
| JP | 4407823 | 2/2010 |
| JP | 2011-046837 | 3/2011 |
| JP | 2011-184650 A | 9/2011 |
| WO | 2009/072465 | 6/2009 |
| WO | 2012/057144 | 5/2012 |
| WO | 2012/132923 | 10/2012 |
| WO | 2013/084819 | 6/2013 |
| WO | 2013/115290 | 8/2013 |
| WO | 2013/129313 | 9/2013 |
| WO | 2014/203866 A1 | 12/2014 |

\* cited by examiner

[Figure 1]
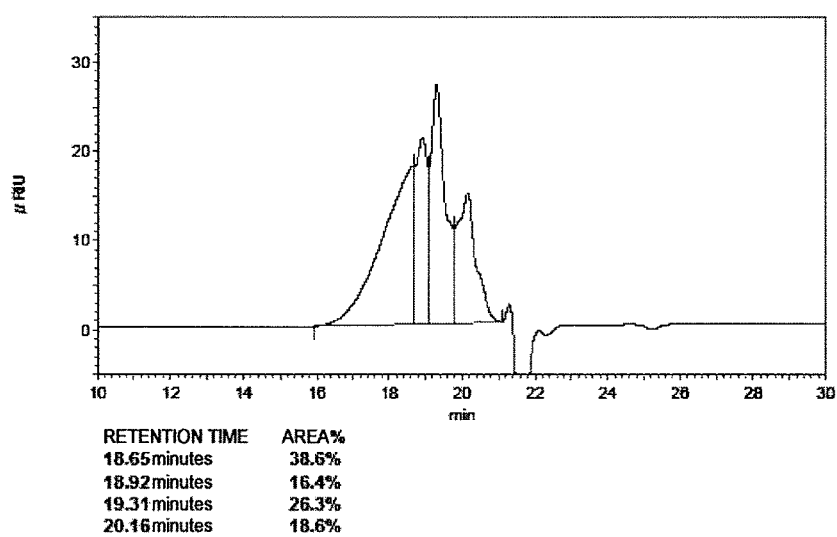

[Figure 2]
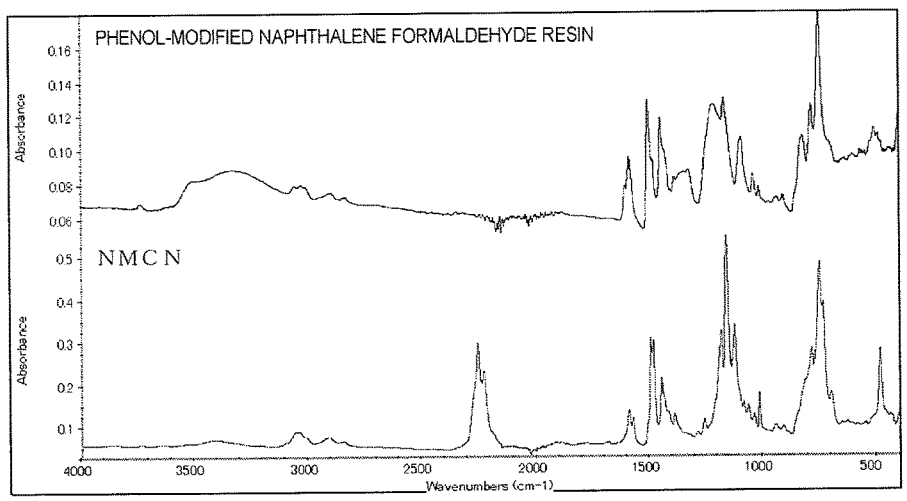

[Figure 3]
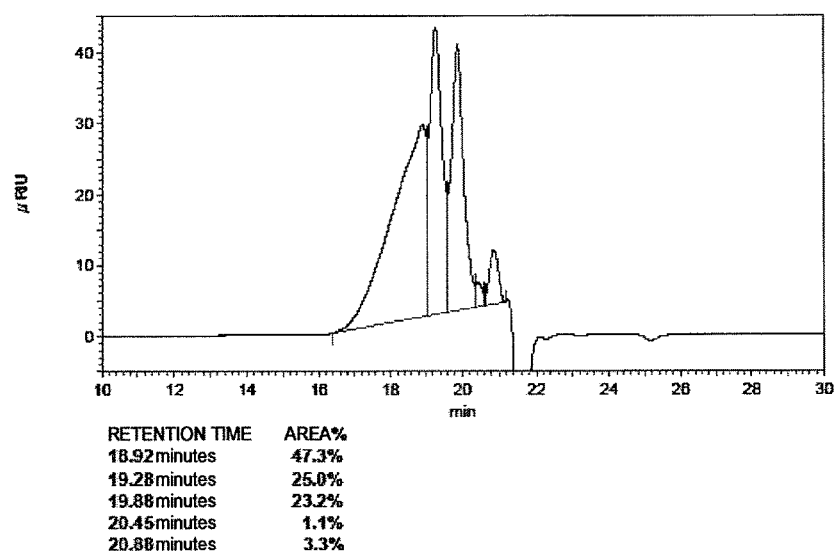

[Figure 4]
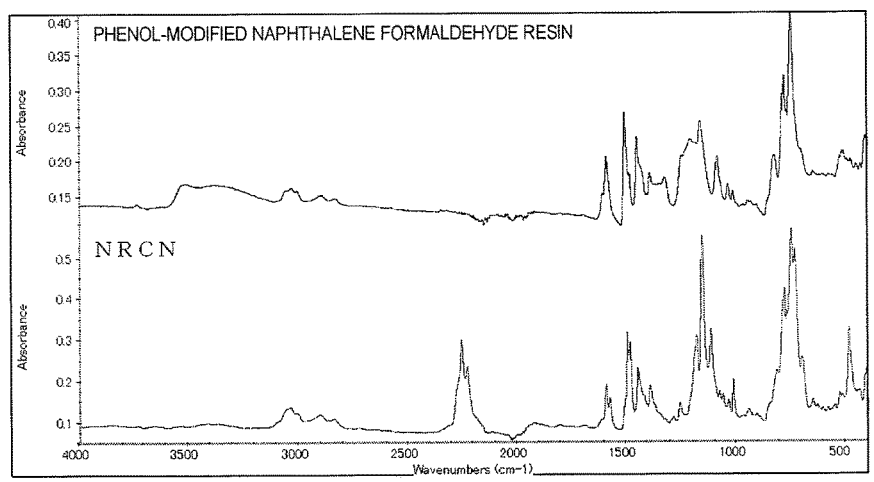

[Figure 5]
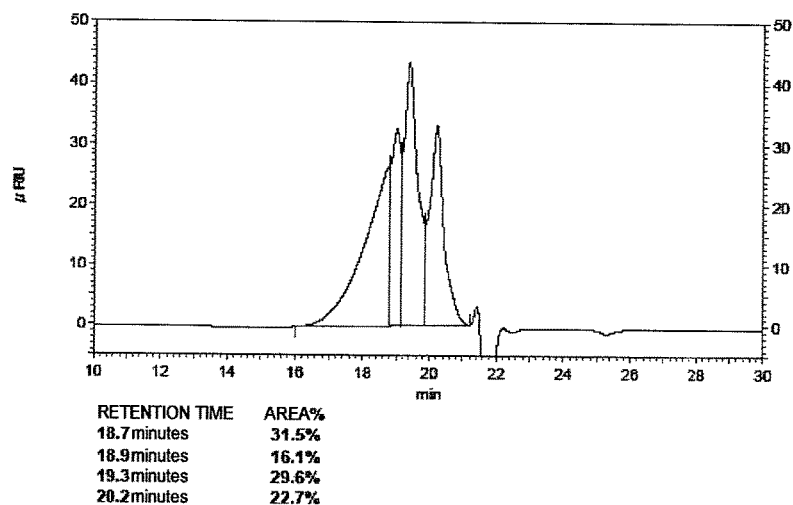

[Figure 6]
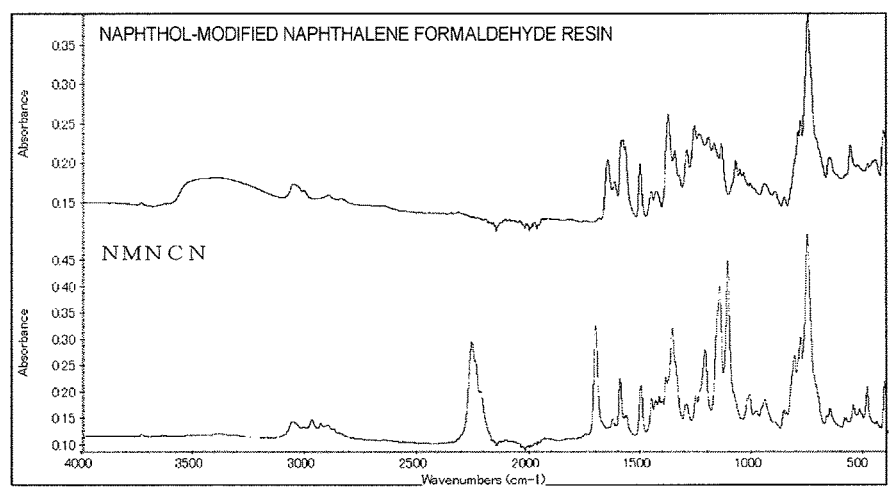

CYANATE ESTER COMPOUND, CURABLE RESIN COMPOSITION CONTAINING SAID COMPOUND, AND CURED PRODUCT OF SAID COMPOSITION

TECHNICAL FIELD

The present invention relates to a cyanate ester compound, a curable resin composition comprising the compound, and a hardened product thereof.

BACKGROUND ART

Cyanate ester compounds produce triazine rings by curing and have high heat resistance and excellent electrical characteristics and therefore are widely used as raw materials of various functional polymer materials such as structural composite materials, adhesives, electrical insulating materials, and electrical and electronic components. However, in recent years, with an advance in required performance in these application fields, various properties required as functional polymer materials have become increasingly strict. Examples of such properties include flame retardancy, heat resistance, a low coefficiency of thermal expansion, low water-absorbing property, a low dielectric constant, a low dielectric loss tangent, weather resistance, chemical resistance, and high fracture toughness. However, functional polymer materials have not always satisfied these required properties so far.

For example, a problem in the semiconductor package material field is that with the thinning of substrates, warpage occurs due to the mismatch of the coefficiencies of thermal expansion between a semiconductor chip and a substrate material. As means for solving this, it is required to improve the low thermal expansion of the functional polymer material itself used for the substrate material.

In addition, when a halogen atom is contained in a functional polymer material, a halogen-based gas, which may cause environmental pollution, may be generated during combustion, and the insulating properties of the final product may be decreased. Further, when a phosphorus atom is contained in a functional polymer material, the required properties other than flame retardancy (heat resistance, moisture resistance, low water-absorbing property, and the like) are often declined. Therefore, it is also required to improve the flame retardancy of the functional polymer material itself without containing a halogen atom or a phosphorus atom.

Further, when a laminate for printed wiring board applications and the like is produced, the step of making a prepreg by first dissolving a precursor of a functional polymer material in a solvent such as methyl ethyl ketone to prepare a varnish, then impregnating a glass cloth with the varnish, and drying it is adopted. Therefore, it is also required to improve the solvent solubility of the monomer before curing that is the precursor of the functional polymer material.

As an example in which a hardened product of a single cyanate ester compound having low thermal expansion is obtained, the use of a bifunctional cyanatophenyl-based cyanate ester compound in which the hydrogen of a methylene group bonding cyanatophenyl groups to each other is replaced by a particular alkyl group (1,1-bis(4-cyanatophenyl)isobutane) is proposed (for example, see Patent Document 1).

As an example in which a hardened product of a single cyanate ester compound having low thermal expansion and flame retardancy is obtained, the use of a cyanate ester compound having an aralkyl structure is proposed (for example, see Patent Document 2).

As an example in which a hardened product of a single cyanate ester compound having lower water-absorbing property than a novolac-based cyanate ester compound is obtained, the use of a cyanate ester compound referred to as an APT resin (a cyanate ester compound obtained by cyanating a resin synthesized from diphenyl ether, formaldehyde, and phenol) is proposed (for example, see Patent Document 3).

LIST OF PRIOR ART DOCUMENTS

Patent Document

Patent Document 1: International Publication No. WO 2012/057144
Patent Document 2: Japanese Patent No. 4407823
Patent Document 3: U.S. Pat. No. 5,264,500

SUMMARY OF INVENTION

Problems to be Solved by Invention

However, when the hydrogen of a methylene group bonding cyanatophenyl groups to each other is replaced by an alkyl group in the bifunctional cyanatophenyl-based cyanate ester compound as described in Patent Document 1, the flame retardancy (low degradability at a high temperature) may decline. In addition, there is no description regarding flame retardancy at all in Patent Document 1.

In addition, the cyanate ester compound having an aralkyl structure as described in Patent Document 2 is poorly soluble in a solvent and may be difficult to handle.

In addition, there is no description regarding properties other than low water-absorbing property at all in Patent Document 3.

So far, a hardened product of a practical single cyanate ester compound having low thermal expansion and flame retardancy at high levels has not been obtained using a cyanate ester compound having solvent solubility.

It is an object of the present invention to provide a novel cyanate ester compound which has excellent solvent solubility and with which a hardened product having a low coefficiency of thermal expansion and excellent flame retardancy is obtained, and a curable resin composition comprising the compound, and the like.

Means for Solving Problems

The present inventors have found that a cyanate ester compound obtained by cyanating a modified naphthalene formaldehyde resin has excellent solvent solubility and excellent handling properties, and a curable resin composition using this cyanate ester compound can realize a hardened product having a low coefficiency of thermal expansion and excellent flame retardancy, and the like, arriving at the present invention. Specifically, the present invention is as follows.

[1]
A cyanate ester compound obtained by cyanating a modified naphthalene formaldehyde resin.
[2]
The cyanate ester compound according to [1], having a structure represented by the following general formula (1):

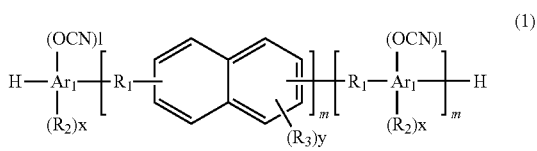

wherein $Ar_1$ represents an aromatic ring, $R_1$ each independently represents a methylene group, a methyleneoxy group, a methyleneoxymethylene group, or an oxymethylene group, and the methylene group, the methyleneoxy group, the methyleneoxymethylene group, and the oxymethylene group may be linked; $R_2$ represents a monovalent substituent and each independently represents a hydrogen atom, an alkyl group, or an aryl group, $R_3$ each independently represents a hydrogen atom, an alkyl group having 1 to 3 carbon atoms, an aryl group, a hydroxy group, or a hydroxymethylene group, m represents an integer of 1 or more, and n represents an integer of 0 or more; the cyanate ester compound may be a mixture of compounds having different m and n; arrangement of repeating units is arbitrary; l represents a number of bonded cyanato groups and is an integer of 1 to 3; x represents a number of bonded $R_2$ and is "a number of possible bonds of $Ar_1$-(l+2);" and y represents an integer of 0 to 4.

[3]

The cyanate ester compound according to [1] or [2], wherein the modified naphthalene formaldehyde resin is obtained by modifying a naphthalene formaldehyde resin or an acetal bond-removed naphthalene formaldehyde resin using a hydroxy-substituted aromatic compound.

[4]

The cyanate ester compound according to [3], wherein the hydroxy-substituted aromatic compound is at least one selected from the group consisting of phenol, 2,6-xylenol, naphthol, dihydroxynaphthalene, biphenol, hydroxyanthracene, and dihydroxyanthracene.

[5]

The cyanate ester compound according to any of [1] to [4], having a weight average molecular weight Mw of 200 to 25000.

[6]

A curable resin composition comprising the cyanate ester compound according to any of [1] to [5].

[7]

The curable resin composition according to [6], further comprising at least one selected from the group consisting of a cyanate ester compound other than the cyanate ester compound according to any of [1] to [5], an epoxy resin, an oxetane resin, and a compound having a polymerizable unsaturated group.

[8]

A hardened product obtained by curing the curable resin composition according to [6] or [7].

[9]

A prepreg obtained by impregnating or coating a base material with the curable resin composition according to [6] or [7] and drying the curable resin composition.

[10]

A laminate obtained by laminating metal foil on the prepreg according to [9] and hot-pressing the metal foil and the prepreg.

[11]

A sealing material comprising the curable resin composition according to [6] or [7].

[12]

A fiber-reinforced composite material comprising the curable resin composition according to [6] or [7].

[13]

An adhesive comprising the curable resin composition according to [6] or [7].

Advantages of Invention

The cyanate ester compound of the present invention has excellent solvent solubility and excellent handling properties. In addition, by using the cyanate ester compound of the present invention, a curable resin composition, a hardened product, and the like having excellent flame retardancy and low thermal expansion can be realized.

BRIEF DESCRIPTION OF DRAWING

FIG. 1 is a GPC chart of a cyanate ester compound NMCN obtained in Example 1.

FIG. 2 is an FT-IR chart of a phenol-modified naphthalene formaldehyde resin and the cyanate ester compound NMCN obtained in Example 1.

FIG. 3 is a GPC chart of a cyanate ester compound NRCN obtained in Example 3.

FIG. 4 is an FT-IR chart of a phenol-modified naphthalene formaldehyde resin and the cyanate ester compound NRCN obtained in Example 3.

FIG. 5 is a GPC chart of a cyanate ester compound NMNCN obtained in Example 5.

FIG. 6 is an FT-IR chart of a naphthol-modified naphthalene formaldehyde resin and the cyanate ester compound NMNCN obtained in Example 5.

MODE FOR CARRYING OUT INVENTION

An embodiment of the present invention (hereinafter also described as "the present embodiment") will be described below. The following embodiment is an illustration for explaining the present invention, and the present invention is not limited only to the embodiment.

The present embodiment includes a cyanate ester compound obtained by cyanating a modified naphthalene formaldehyde resin, and a curable resin composition comprising the cyanate ester compound.

In addition, in another aspect of the present embodiment, a hardened product obtained by curing the above curable resin composition, and a sealing material, a fiber-reinforced composite material, an adhesive, and a laminate comprising the above curable resin composition are also provided.

<<Cyanate Ester Compound>>

The cyanate ester compound of the present embodiment is obtained by cyanating a modified naphthalene formaldehyde resin.

<Modified Naphthalene Formaldehyde Resin>

The modified naphthalene formaldehyde resin that is a raw material of the cyanate ester compound of the present embodiment is preferably obtained by modifying a naphthalene formaldehyde resin or an acetal bond-removed naphthalene formaldehyde resin, for example, with a hydroxy-substituted aromatic compound as represented by formula (2). When such a modified naphthalene formaldehyde resin is used as a raw material, a hardened product of a single cyanate ester compound having flame retardancy, low water-absorbing property, moisture absorption and heat resistance properties, heat resistance, low thermal expansion, and the like tends to be obtained.

Here, the naphthalene formaldehyde resin is a resin obtained by subjecting a naphthalene compound and formaldehyde to a condensation reaction in the presence of an acidic catalyst. In addition, the acetal bond-removed naphthalene formaldehyde resin is a resin obtained by treating a naphthalene formaldehyde resin in the presence of water and an acidic catalyst.

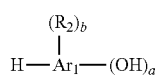
(2)

wherein $Ar_1$ represents an aromatic ring; $R_2$ represents a monovalent substituent and is each independently a hydrogen atom, an alkyl group, or an aryl group; any position can be selected for the substituents on the above aromatic ring; a represents the number of bonded hydroxy groups and is an integer of 1 to 3; and b represents the number of bonded $R_2$ and is "the number of possible bonds of $Ar_1$-(a+1)."

Methods for producing a naphthalene formaldehyde resin, an acetal bond-removed naphthalene formaldehyde resin, and a modified naphthalene formaldehyde resin will be described below.

<Method for Producing Naphthalene Formaldehyde Resin>

A naphthalene formaldehyde resin is obtained by subjecting a naphthalene compound and formaldehyde to a condensation reaction in the presence of an acidic catalyst.

The naphthalene compound used in the above condensation reaction is naphthalene and/or naphthalenemethanol. The naphthalene and the naphthalenemethanol are not particularly limited, and industrially available ones can be used.

The formaldehyde used in the above condensation reaction is not particularly limited. Examples thereof include usually industrially available aqueous solutions of formaldehyde. In addition, compounds that generate formaldehyde, such as paraformaldehyde and trioxane, and the like can also be used. From the viewpoint of gelation suppression, aqueous solutions of formaldehyde are preferred.

The molar ratio of the naphthalene compound to the formaldehyde (the naphthalene compound:the formaldehyde) in the above condensation reaction is 1:1 to 1:20, preferably 1:1.5 to 1:17.5, more preferably 1:2 to 1:15, further preferably 1:2 to 1:12.5, and particularly preferably 1:2 to 1:10. By setting the molar ratio of the naphthalene compound to the formaldehyde in the above condensation reaction in such a range, the yield of the obtained naphthalene formaldehyde resin can be maintained relatively high, and the amount of the remaining unreacted formaldehyde can be decreased.

For the acidic catalyst used in the above condensation reaction, well-known inorganic acids and organic acids can be used. Specific examples of the acidic catalyst are not particularly limited and include an inorganic acid such as hydrochloric acid, sulfuric acid, phosphoric acid, hydrobromic acid, or hydrofluoric acid, an organic acid such as oxalic acid, malonic acid, succinic acid, adipic acid, sebacic acid, citric acid, fumaric acid, maleic acid, formic acid, p-toluenesulfonic acid, methanesulfonic acid, trifluoroacetic acid, dichloroacetic acid, trichloroacetic acid, trifluoromethanesulfonic acid, benzenesulfonic acid, naphthalenesulfonic acid, or naphthalenedisulfonic acid, a Lewis acid such as zinc chloride, aluminum chloride, iron chloride, or boron trifluoride, or a solid acid such as silicotungstic acid, phosphotungstic acid, silicomolybdic acid, or phosphomolybdic acid. Among these, from the viewpoint of production, sulfuric acid, oxalic acid, citric acid, p-toluenesulfonic acid, methanesulfonic acid, trifluoromethanesulfonic acid, benzenesulfonic acid, naphthalenesulfonic acid, naphthalenedisulfonic acid, and phosphotungstic acid are preferred.

The amount of the above acidic catalyst used is preferably 0.0001 to 100 parts by mass, more preferably 0.001 to 85 parts by mass, and further preferably 0.001 to 70 parts by mass based on 100 parts by mass of the total amount of the naphthalene compound and the formaldehyde. By setting in such a range the amount of the above acidic catalyst used, an appropriate reaction rate is obtained, and an increase in resin viscosity based on a high reaction rate can be prevented. In addition, the acidic catalyst may be charged at once or in portions.

The above condensation reaction is performed in the presence of the acidic catalyst usually at normal pressure and is preferably performed with heating and refluxing at a temperature at which the raw materials used are compatible or higher (usually 80 to 300° C.) or while the produced water is distilled off. The reaction pressure may be normal pressure or applied pressure. An inert gas such as nitrogen, helium, or argon may be passed through the system as required.

In addition, a solvent inert in the condensation reaction can also be used as required. The solvent is not particularly limited. Examples thereof include aromatic hydrocarbon-based solvents such as toluene, ethylbenzene, and xylene, saturated aliphatic hydrocarbon-based solvents such as heptane and hexane, alicyclic hydrocarbon-based solvents such as cyclohexane, ether-based solvents such as dioxane and dibutyl ether, ketone-based solvents such as methyl isobutyl ketone, carboxylate-based solvents such as ethyl propionate, and carboxylic acid-based solvents such as acetic acid.

The above condensation reaction is not particularly limited but is preferably performed in coexistence with an alcohol from the viewpoint that when an alcohol coexists, the ends of the resin are capped with the alcohol, and a low molecular weight and low dispersion (narrow molecular weight distribution) naphthalene formaldehyde resin is obtained, which provides a resin also having good solvent solubility and low melt viscosity after modification. The above alcohol is not particularly limited. Examples thereof include monools having 1 to 12 carbon atoms and diols having 1 to 12 carbon atoms. The above alcohol may be added alone, or a plurality of the above alcohols may be used in combination. From the viewpoint of the productivity of the naphthalene formaldehyde resin, among these, propanol, butanol, octanol, and 2-ethylhexanol are preferred. When an alcohol coexists, the amount of the alcohol used is not particularly limited, but, for example, 1 to 10 equivalents of hydroxyl groups in the alcohol based on 1 equivalent of methylol groups in naphthalenemethanol is preferred.

The above condensation reaction may be a condensation reaction in which a naphthalene compound, formaldehyde, and an acidic catalyst are simultaneously added to a reaction system, or a condensation reaction in which a naphthalene compound is sequentially added to a system in which formaldehyde and an acidic catalyst are present. The above sequential addition method is preferred from the viewpoint that the oxygen concentration in the obtained resin is increased, and a larger amount of the resin can be reacted with a hydroxy-substituted aromatic compound in the subsequent modification step.

The reaction time in the above condensation reaction is preferably 0.5 to 30 hours, more preferably 0.5 to 20 hours, and further preferably 0.5 to 10 hours. By setting the reaction time in the above condensation reaction in such a range, a resin having target properties is economically and industrially advantageously obtained.

The reaction temperature in the above condensation reaction is preferably 80 to 300° C., more preferably 85 to 270° C., and further preferably 90 to 240° C. By setting the reaction temperature in the above condensation reaction in such a range, a resin having target properties is economically and industrially advantageously obtained.

After the completion of the reaction, the above solvent is further added, as required, for dilution, and then the reaction liquid is left at rest for two-phase separation to separate the resin phase, which is the oil phase, and the aqueous phase. Then, water washing is further performed to completely remove the acidic catalyst, and the added solvent and the unreacted raw materials are removed by a general method such as distillation. Thus, a naphthalene formaldehyde resin is obtained.

It is preferred that in the naphthalene formaldehyde resin obtained by the above reaction, at least some of the naphthalene rings are crosslinked by the following general formula (3) and/or the following general formula (4).

  (3)

wherein c represents an integer of 1 to 10.

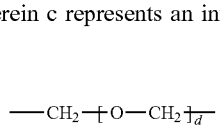  (4)

wherein d represents an integer of 0 to 10.

In addition, at least some of the naphthalene rings may be crosslinked by a bond in which the bond represented by the above general formula (3) and a bond represented by the following general formula (5) are randomly arranged, for example, the following general formula (6), (7), or (8) or the like.

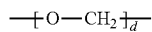  (5)

wherein d represents an integer of 0 to 10.

—CH$_2$—O—CH$_2$—CH$_2$—  (6)

—CH$_2$—CH$_2$—O—CH$_2$—  (7)

—CH$_2$—O—CH$_2$—O—CH$_2$—CH$_2$—  (8)

<Method for Producing Acetal Bond-Removed Naphthalene Formaldehyde Resin>

An acetal bond-removed naphthalene formaldehyde resin is obtained by treating the above naphthalene formaldehyde resin in the presence of water and an acidic catalyst. In the present embodiment, this treatment is referred to as deacetalization.

The acetal bond-removed naphthalene formaldehyde resin refers to a naphthalene formaldehyde resin in which by deacetalization, the number of bonds between oxymethylene groups without a naphthalene ring decreases, and c in the above general formula (3) and/or d in the above general formula (4) decrease. In the acetal bond-removed naphthalene formaldehyde resin obtained in this manner, compared with the above naphthalene formaldehyde resin, the amount of the residue during the pyrolysis of the resin obtained after modification becomes larger, that is, the mass reduction percentage becomes lower.

The above naphthalene formaldehyde resin can be used in the above deacetalization.

The acidic catalyst used in the above deacetalization can be appropriately selected from well-known inorganic acids and organic acids. Specific examples of the acidic catalyst are not particularly limited and include an inorganic acid such as hydrochloric acid, sulfuric acid, phosphoric acid, hydrobromic acid, or hydrofluoric acid, an organic acid such as oxalic acid, malonic acid, succinic acid, adipic acid, sebacic acid, citric acid, fumaric acid, maleic acid, formic acid, p-toluenesulfonic acid, methanesulfonic acid, trifluoroacetic acid, dichloroacetic acid, trichloroacetic acid, tri fluoromethanesulfonic acid, benzenesulfonic acid, naphthalenesulfonic acid, or naphthalenedisulfonic acid, a Lewis acid such as zinc chloride, aluminum chloride, iron chloride, or boron trifluoride, or a solid acid such as silicotungstic acid, phosphotungstic acid, silicomolybdic acid, or phosphomolybdic acid. Among these, from the viewpoint of production, sulfuric acid, oxalic acid, citric acid, p-toluenesulfonic acid, methanesulfonic acid, tri fluoromethanesulfonic acid, benzenesulfonic acid, naphthalenesulfonic acid, naphthalenedisulfonic acid, and phosphotungstic acid are preferred.

The above deacetalization is performed in the presence of the acidic catalyst usually at normal pressure and is preferably performed while the water used is dropped, or sprayed as steam, into the system at a temperature at which the raw materials used are compatible or higher (usually 80 to 300° C.). The water in the system may be distilled off or refluxed but is preferably distilled off together with low boiling point components such as formaldehyde generated in the reaction because acetal bonds can be efficiently removed. The reaction pressure may be normal pressure or applied pressure. An inert gas such as nitrogen, helium, or argon may be passed through the system as required.

In addition, a solvent inert in the deacetalization can also be used as required. The solvent is not particularly limited. Examples thereof include aromatic hydrocarbon-based solvents such as toluene, ethylbenzene, and xylene, saturated aliphatic hydrocarbon-based solvents such as heptane and hexane, alicyclic hydrocarbon-based solvents such as cyclohexane, ether-based solvents such as dioxane and dibutyl ether, ketone-based solvents such as methyl isobutyl ketone, carboxylate-based solvents such as ethyl propionate, and carboxylic acid-based solvents such as acetic acid.

The amount of the above acidic catalyst used is preferably 0.0001 to 100 parts by mass, more preferably 0.001 to 85 parts by mass, and further preferably 0.001 to 70 parts by mass based on 100 parts by mass of the naphthalene formaldehyde resin. By setting in such a range the amount of the above acidic catalyst used, an appropriate reaction rate is obtained, and an increase in resin viscosity based on a high reaction rate can be prevented. In addition, the acidic catalyst may be charged at once or in portions.

The water used in the above deacetalization is not particularly limited as long as it can be industrially used. Examples of the water include tap water, distilled water, ion-exchanged water, pure water, or ultrapure water.

The amount of the above water used is preferably 0.1 to 10000 parts by mass, more preferably 1 to 5000 parts by mass, and further preferably 10 to 3000 parts by mass based on 100 parts by mass of the naphthalene formaldehyde resin.

The reaction time in the above deacetalization is preferably 0.5 to 20 hours, more preferably 1 to 15 hours, and further preferably 2 to 10 hours. By setting the reaction time in the above deacetalization in such a range, a resin having target properties is economically and industrially obtained.

The reaction temperature in the above deacetalization is preferably 80 to 300° C., more preferably 85 to 270° C., and further preferably 90 to 240° C. By setting the reaction temperature in the above deacetalization in such a range, a resin having target properties is economically and industrially obtained.

In the acetal bond-removed naphthalene formaldehyde resin, compared with the naphthalene formaldehyde resin, the oxygen concentration decreases, and the softening point rises. For example, when deacetalization is performed with an amount of the acidic catalyst used of 0.05 parts by mass, an amount of water used of 2000 parts by mass, a reaction time of 5 hours, and a reaction temperature of 150° C. described above, the oxygen concentration decreases by about 0.1 to 8.0% by mass, and the softening point rises by about 3 to 100° C.

<Method for Producing Modified Naphthalene Formaldehyde Resin>

A modified naphthalene formaldehyde resin is obtained by heating the above naphthalene formaldehyde resin or the above acetal bond-removed naphthalene formaldehyde resin and, for example, a hydroxy-substituted aromatic compound represented by the following general formula (2), in the presence of an acidic catalyst for a modification condensation reaction. In the present embodiment, this reaction is referred to as modification.

(2)

wherein $Ar_1$ represents an aromatic ring; $R_2$ represents a monovalent substituent and is each independently a hydrogen atom, an alkyl group, or an aryl group; any position can be selected for the substituents on the above aromatic ring; a represents the number of bonded hydroxy groups and is an integer of 1 to 3; and b represents the number of bonded $R_2$ and is "the number of possible bonds of $Ar_1$-(a+1)."

In the above general formula (2), examples of the aromatic ring include, but are not particularly limited to, a benzene ring, a naphthalene ring, and an anthracene ring. In addition, examples of the alkyl group of $R_2$ include, but are not particularly limited to, linear or branched alkyl groups having 1 to 8 carbon atoms, more preferably linear or branched alkyl groups having 1 to 4 carbon atoms, for example, a methyl group, an ethyl group, a propyl group, an isopropyl group, a butyl group, a sec-butyl group, and a tert-butyl group. Further, examples of the aryl group of $R_2$ include, but are not particularly limited to, a phenyl group, a p-tolyl group, a naphthyl group, and an anthryl group. Specific examples of the hydroxy-substituted aromatic compound represented by the above general formula (2) are not particularly limited and include phenol, 2,6-xylenol, naphthol, dihydroxynaphthalene, biphenol, hydroxyanthracene, and dihydroxyanthracene. One of these may be used alone, or two or more of these may be used in combination.

The amount of the above hydroxy-substituted aromatic compound used is preferably 0.1 to 5 mol, more preferably 0.2 to 4 mol, and further preferably 0.3 to 3 mol based on 1 mol of contained oxygen in the naphthalene formaldehyde resin or the acetal bond-removed naphthalene formaldehyde resin. By setting in such a range the amount of the above hydroxy-substituted aromatic compound used, the yield of the obtained modified naphthalene formaldehyde resin can be maintained relatively high, and the amount of the remaining unreacted hydroxy-substituted aromatic compound can be decreased. The molecular weight of the obtained modified naphthalene formaldehyde resin is affected by the number of moles of contained oxygen in the naphthalene formaldehyde resin or the acetal bond-removed naphthalene formaldehyde resin and the amount of the hydroxy-substituted aromatic compound used. When both increase, the molecular weight decreases. Here, for the number of moles of contained oxygen can be obtained by measuring the oxygen concentration (% by mass) in the naphthalene formaldehyde resin or the acetal bond-removed naphthalene formaldehyde resin and calculating the number of moles of contained oxygen according to the following calculation formula:

the number of moles of contained oxygen (mol)=the amount of the resin used (g)×oxygen concentration (% by mass)/16.

The acidic catalyst used in the above modification reaction can be appropriately selected from well-known inorganic acids and organic acids. Specific examples of the acidic catalyst are not particularly limited and include an inorganic acid such as hydrochloric acid, sulfuric acid, phosphoric acid, hydrobromic acid, or hydrofluoric acid, an organic acid such as oxalic acid, malonic acid, succinic acid, adipic acid, sebacic acid, citric acid, fumaric acid, maleic acid, formic acid, p-toluenesulfonic acid, methanesulfonic acid, trifluoroacetic acid, dichloroacetic acid, trichloroacetic acid, trifluoromethanesulfonic acid, benzenesulfonic acid, naphthalenesulfonic acid, or naphthalenedisulfonic acid, a Lewis acid such as zinc chloride, aluminum chloride, iron chloride, or boron trifluoride, or a solid acid such as silicotungstic acid, phosphotungstic acid, silicomolybdic acid, or phosphomolybdic acid.

Among these, from the viewpoint of production, sulfuric acid, oxalic acid, citric acid, p-toluenesulfonic acid, methanesulfonic acid, trifluoromethanesulfonic acid, benzenesulfonic acid, naphthalenesulfonic acid, naphthalenedisulfonic acid, and phosphotungstic acid are preferred.

The amount of the above acidic catalyst used is preferably 0.0001 to 100 parts by mass, more preferably 0.001 to 85 parts by mass, and further preferably 0.001 to 70 parts by mass based on 100 parts by mass of the naphthalene formaldehyde resin or the acetal bond-removed naphthalene formaldehyde resin. By setting in such a range the amount of the above acidic catalyst used, an appropriate reaction rate is obtained, and an increase in resin viscosity based on a high reaction rate can be prevented. In addition, the acidic catalyst may be charged at once or in portions.

The above modification reaction is performed in the presence of the acidic catalyst usually at normal pressure and is preferably performed with heating and refluxing at a temperature at which the raw materials used are compatible or higher (usually 80 to 300° C.) or while the produced water is distilled off. The reaction pressure may be normal pressure or applied pressure. An inert gas such as nitrogen, helium, or argon may be passed through the system as required.

In addition, a solvent inert in the modification reaction can also be used as required. The solvent is not particularly limited. Examples thereof include aromatic hydrocarbon-based solvents such as toluene, ethylbenzene, and xylene, saturated aliphatic hydrocarbon-based solvents such as heptane and hexane, alicyclic hydrocarbon-based solvents such as cyclohexane, ether-based solvents such as dioxane and dibutyl ether, alcohol-based solvents such as 2-propanol, ketone-based solvents such as methyl isobutyl ketone, carboxylate-based solvents such as ethyl propionate, and carboxylic acid-based solvents such as acetic acid.

The reaction time in the above modification reaction is preferably 0.5 to 20 hours, more preferably 1 to 15 hours, and further preferably 2 to 10 hours. By setting the reaction time in the above modification reaction in such a range, a resin having target properties is economically and industrially obtained.

The reaction temperature in the above modification reaction is preferably 80 to 300° C., more preferably 85 to 270° C., and further preferably 90 to 240° C. By setting the reaction temperature in the above modification reaction in such a range, a resin having target properties is economically and industrially obtained.

After the completion of the reaction, the above solvent is further added, as required, for dilution, and then the reaction liquid is left at rest for two-phase separation to separate the resin phase, which is the oil phase, and the aqueous phase. Then, water washing is further performed to completely remove the acidic catalyst, and the added solvent and the unreacted raw materials are removed by a general method such as distillation. Thus, a modified naphthalene formaldehyde resin is obtained.

In the modified naphthalene formaldehyde resin, compared with the naphthalene formaldehyde resin or the acetal bond-removed naphthalene formaldehyde resin, the amount of the residue during pyrolysis becomes larger (the mass reduction percentage becomes lower), and the hydroxyl group value rises. For example, when modification is performed with an amount of the acidic catalyst used of 0.05 parts by mass, a reaction time of 5 hours, and a reaction temperature of 200° C. described above, the amount of the residue during pyrolysis increases by about 1 to 50%, and the hydroxyl group value rises by about 1 to 300.

The modified naphthalene formaldehyde resin obtained by the above production method is not particularly limited but is preferably, for example, a modified naphthalene formaldehyde resin represented by the following general formula (9):

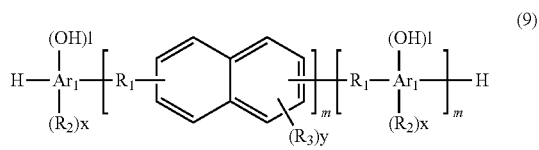

wherein $Ar_1$ represents an aromatic ring, $R_1$ each independently represents a methylene group, a methyleneoxy group, a methyleneoxymethylene group, or an oxymethylene group, and the methylene group, the methyleneoxy group, the methyleneoxymethylene group, and the oxymethylene group may be linked; $R_2$ represents a monovalent substituent and each independently represents a hydrogen atom, an alkyl group, or an aryl group, $R_3$ each independently represents a hydrogen atom, an alkyl group having 1 to 3 carbon atoms, an aryl group, a hydroxy group, or a hydroxymethylene group, m represents an integer of 1 or more, and n represents an integer of 0 or more; the modified naphthalene formaldehyde resin may be a mixture of compounds having different m and n; l represents the number of bonded hydroxy groups and is an integer of 1 to 3; x represents the number of bonded $R_2$ and is "the number of possible bonds of $Ar_1$-(l+2);" and y represents an integer of 0 to 4.

In the above general formula (9), the arrangement of the repeating units is arbitrary. In other words, the compound of formula (9) may be a random copolymer or a block copolymer. The upper limit value of m is preferably 50 or less, more preferably 20 or less. The upper limit value of n is preferably 20 or less.

In the above method for producing a modified naphthalene formaldehyde resin, the main product is, for example, a compound in which naphthalene rings and/or the aromatic rings of a hydroxy-substituted aromatic compound are bonded to each other via a methylene group formed from formaldehyde during modification. The modified naphthalene formaldehyde resin obtained after modification is usually obtained as a mixture of many compounds because the positions at which formaldehyde is bonded to a naphthalene ring and the aromatic ring of the hydroxy-substituted aromatic compound, the position at which a hydroxy group is bonded, the number of polymerizations, and the like are not the same.

For example, a phenol-modified naphthalene formaldehyde resin obtained by modifying with phenol a naphthalene formaldehyde resin obtained from naphthalene or naphthalenemethanol and an aqueous solution of formalin is specifically a mixture comprising compounds represented by the following general formulas (10) to (17) as typical compositions.

In addition, a phenol-modified naphthalene formaldehyde resin obtained by deacetalizing a naphthalene formaldehyde resin obtained from naphthalene or naphthalenemethanol and an aqueous solution of formalin and then modifying the deacetalized naphthalene formaldehyde resin with phenol is specifically a mixture comprising the compounds represented by the following general formulas (10), (11), (12), (14), (15), (16), and (17) as typical compositions.

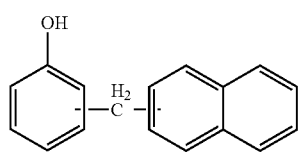

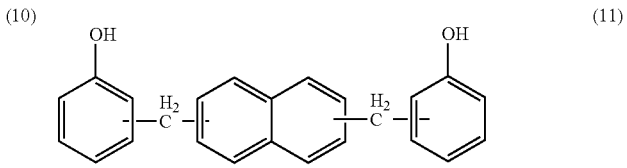

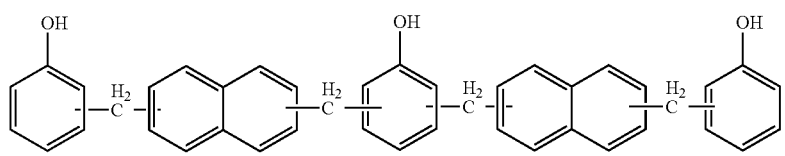

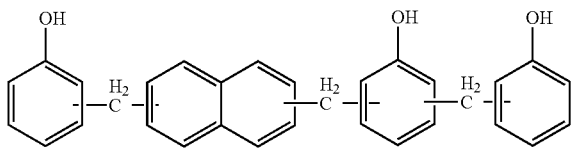

(13)

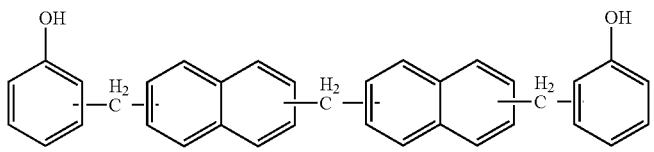

(14)

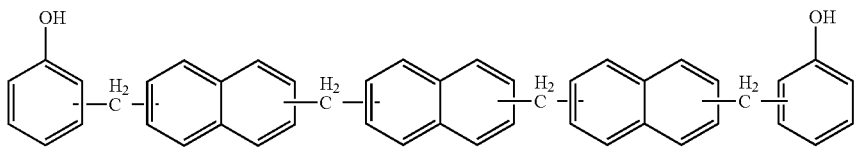

(15)

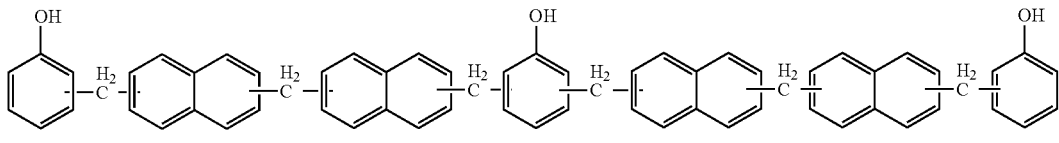

(16)

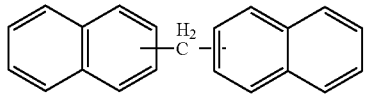

(17)

Among these, the aromatic hydrocarbon compound having no hydroxy group in the structure such as the above formula (17) may be removed in advance by distillation separation or the like because it cannot be cyanated.

From the viewpoint of further increasing handling properties and further increasing the flame retardancy of the obtained curable resin composition and hardened product, the modified naphthalene formaldehyde resin preferably has an OH value of 140 to 560 mg KOH/g (an OH group equivalent of 100 to 400 g/eq.), more preferably 160 to 470 mg KOH/g (an OH group equivalent of 120 to 350 g/eq.), as obtained based on JIS-K1557-1.

<Method for Producing Cyanate Ester Compound>

The cyanate ester compound of the present embodiment is obtained, for example, by cyanating the hydroxy groups of the above modified naphthalene formaldehyde resin. The cyanation method is not particularly limited, and known methods can be applied. Specifically, the cyanate ester compound of the present embodiment can be obtained by, for example, a method of reacting a modified naphthalene formaldehyde resin and a cyanogen halide in a solvent in the presence of a basic compound, a method of reacting a modified naphthalene formaldehyde resin and a cyanogen halide in a solvent in the presence of a base so that the cyanogen halide is always present in excess of the base (U.S. Pat. No. 3,553,244), a method of adding a tertiary amine and then dropping a cyanogen halide, or dropping both a cyanogen halide and a tertiary amine, into a modified naphthalene formaldehyde resin in the presence of a solvent while using the tertiary amine as a base and using the tertiary amine in excess of the cyanogen halide (Japanese Patent No. 3319061), a method of reacting a modified naphthalene formaldehyde resin, a trialkylamine, and a cyanogen halide in a continuous plug flow mode (Japanese Patent No. 3905559), a method of treating with a cation and anion exchange pair a tert-ammonium halide produced as a by-product in reacting a modified naphthalene formaldehyde resin and a cyanogen halide in a nonaqueous solution in the presence of a tert-amine (Japanese Patent No. 4055210), a method of simultaneously adding a tertiary amine and a cyanogen halide in the presence of a solvent separable from water to react a modified naphthalene formaldehyde resin followed by water washing and separation, and precipitation and purification from the obtained solution using a poor solvent of a secondary or tertiary alcohol or a hydrocarbon (Japanese Patent No. 2991054), and further a method of reacting a naphthol, a cyanogen halide, and a tertiary amine in a two-phase solvent of water and an organic solvent under acidic conditions (Japanese Patent No. 5026727).

When the above-described method of reacting a modified naphthalene formaldehyde resin and a cyanogen halide in a solvent in the presence of a basic compound is used, it is preferred that the modified naphthalene formaldehyde resin, a reaction substrate, is dissolved in advance in either a cyanogen halide solution or a basic compound solution, and then the cyanogen halide solution and the basic compound solution are brought into contact with each other. The method for bringing the cyanogen halide solution and the basic compound solution into contact with each other is not particularly limited. Examples thereof include (A) a method of adding a basic compound solution dropwise to a cyanogen halide solution during stirring and mixing, (B) a method of adding a cyanogen halide solution dropwise to a basic compound solution during stirring and mixing, and (C) a method of continuously alternately or simultaneously supplying the cyanogen halide solution and the basic compound solution.

Among the above (A) to (C) methods, the contact is preferably performed by the (A) method because side reactions are suppressed, and a cyanate ester compound having higher purity can be obtained with high yield.

In addition, the above method for bringing the cyanogen halide solution and the basic compound solution into contact with each other can be performed either in a semibatch form or in a continuous flow form.

Particularly, when the (A) method is used, the basic compound is preferably poured in portions because the reaction can be completed without allowing the hydroxy groups of the modified naphthalene formaldehyde resin to remain, and a cyanate ester compound having higher purity can be obtained with high yield. The number of portions is not particularly limited but is preferably 1 to 5. In addition, the type of the basic compound may be the same or different from portion to portion.

The cyanogen halide used in the present embodiment is not particularly limited. Examples thereof include cyanogen chloride and cyanogen bromide. For the cyanogen halide, a cyanogen halide obtained by a known production method such as a method of reacting hydrogen cyanide or a metal cyanide and a halogen may be used, or a commercial product may be used. In addition, a reaction liquid containing a cyanogen halide obtained by reacting hydrogen cyanide or a metal cyanide and a halogen can also be used as it is.

In the present embodiment, when a cyanogen halide is used when the modified naphthalene formaldehyde resin is cyanated, the amount of the cyanogen halide used based on the modified naphthalene formaldehyde resin is preferably 0.5 to 5 mol, more preferably 1.0 to 3.5, based on 1 mol of the hydroxy groups of the modified naphthalene formaldehyde resin.

The reason is that the yield of the cyanate ester compound is increased without allowing the unreacted modified naphthalene formaldehyde resin to remain.

The solvent used in the cyanogen halide solution is not particularly limited. For example, any of ketone-based solvents such as acetone, methyl ethyl ketone, and methyl isobutyl ketone, aliphatic solvents such as n-hexane, cyclohexane, isooctane, cyclohexanone, and cyclopentanone, aromatic solvents such as benzene, toluene, and xylene, ether-based solvents such as diethyl ether, dimethyl cellosolve, diglyme, tetrahydrofuran, methyltetrahydrofuran, dioxane, and tetraethylene glycol dimethyl ether, halogenated hydrocarbon-based solvents such as dichloromethane, chloroform, carbon tetrachloride, dichloroethane, trichloroethane, chlorobenzene, and bromobenzene, alcohol-based solvents such as methanol, ethanol, isopropanol, methyl cellosolve, and propylene glycol monomethyl ether, aprotic polar solvents such as N,N-dimethylformamide, N-methylpyrrolidone, 1,3-dimethyl-2-imidazolidone, and dimethyl sulfoxide, nitrile-based solvents such as acetonitrile and benzonitrile, nitro-based solvents such as nitromethane and nitrobenzene, ester-based solvents such as ethyl acetate and ethyl benzoate, hydrocarbon-based solvents such as cyclohexane, water solvents, and the like can be used. One type can be used or two or more types can be used in combination according to the reaction substrate.

In the present embodiment, when a basic compound is used when the modified naphthalene formaldehyde resin is cyanated, either an organic or inorganic base can be used as the basic compound.

As the organic base, particularly, tertiary amines such as trimethylamine, triethylamine, tri-n-butylamine, triamylamine, diisopropylethylamine, diethyl-n-butylamine, methyldi-n-butylamine, methylethyl-n-butylamine, dodecyldimethylamine, tribenzylamine, triethanolamine, N,N-dimethylaniline, N,N-diethylaniline, diphenylmethylamine, pyridine, diethylcyclohexylamine, tricyclohexylamine, 1,4-diazabicyclo[2.2.2]octane, 1,8-diazabicyclo[5.4.0]-7-undecene, and 1,5-diazabicyclo[4.3.0]-5-nonene are preferred. Among these, because the target material is obtained with good yield, and so on, trimethylamine, triethylamine, tri-n-butylamine, and diisopropylethylamine are more preferred, and triethylamine is particularly preferred.

The amount of the above organic base used is preferably 0.1 to 8 mol, more preferably 1.0 to 3.5 mol, based on 1 mol of the hydroxy groups of the phenolic resin.

The reason is that the yield of the cyanate ester compound is increased without allowing the unreacted modified naphthalene formaldehyde resin to remain.

As the inorganic base, hydroxides of alkali metals are preferred. The hydroxides of alkali metals are not particularly limited. Examples thereof include industrially generally used sodium hydroxide, potassium hydroxide, and lithium hydroxide. In terms of being available at low cost, sodium hydroxide is particularly preferred.

The amount of the above inorganic base used is preferably 1.0 to 5.0 mol, more preferably 1.0 to 3.5 mol, based on 1 mol of the hydroxy groups of the modified naphthalene formaldehyde resin.

The reason is that the yield of the cyanate ester compound is increased without allowing the unreacted modified naphthalene formaldehyde resin to remain.

In the present embodiment, the basic compound can be used as a solution of the basic compound dissolved in a solvent as described above. As the solvent, an organic solvent or water can be used.

The amount of the solvent used in the basic compound solution is preferably 0.1 to 100 parts by mass, more preferably 0.5 to 50 parts by mass, based on 1 part by mass of the modified naphthalene formaldehyde resin when the modified naphthalene formaldehyde resin is dissolved in the basic compound solution.

The amount of the solvent used in the basic compound solution is preferably 0.1 to 100 parts by mass, more preferably 0.25 to 50 parts by mass, based on 1 part by mass of the basic compound when the modified naphthalene formaldehyde resin is not dissolved in the basic compound solution.

The organic solvent that dissolves the basic compound is preferably used when the basic compound is an organic base. Specific examples of the organic solvent that dissolves the basic compound are not particularly limited. For example, a ketone-based solvent such as acetone, methyl ethyl ketone, or methyl isobutyl ketone, an aromatic solvent such as benzene, toluene, or xylene, an ether-based solvent such as diethyl ether, dimethyl cellosolve, diglyme, tetrahydrofuran, methyltetrahydrofuran, dioxane, or tetraethylene glycol dimethyl ether, a halogenated hydrocarbon-based solvent such as dichloromethane, chloroform, carbon tetrachloride, dichloroethane, trichloroethane, chlorobenzene, or bromobenzene, an alcohol-based solvent such as methanol, ethanol, isopropanol, methyl cellosolve, or propylene glycol monomethyl ether, an aprotic polar solvent such as N,N-dimethylformamide, N-methylpyrrolidone, 1,3-dimethyl-2-imidazolidone, or dimethyl sulfoxide, a nitrile-based solvent such as acetonitrile or benzonitrile, a nitro-based solvent such as nitromethane or nitrobenzene, an ester-based solvent such as ethyl acetate or ethyl benzoate, or a hydrocarbon-based solvent such as cyclohexane can be appropriately selected according to the basic compound, the reaction substrate, and the solvent used in the reaction. One type of these can be used or two or more types of these can be used in combination.

The water that dissolves the basic compound is preferably used when the basic compound is an inorganic base. The water is not particularly restricted and may be tap water, distilled water, or deionized water. In terms of efficiently obtaining the target cyanate ester compound, the use of distilled water or deionized water having small amounts of impurities is preferred.

When the solvent used in the basic compound solution is water, a catalytic amount of an organic base is preferably used as a surfactant from the viewpoint of ensuring the reaction rate. Especially, tertiary amines with few side reactions are preferred. The tertiary amines may be any of alkylamines, arylamines, and cycloalkylamines. Specific examples of the tertiary amines are not particularly limited and include trimethylamine, triethylamine, tri-n-butylamine, triamylamine, diisopropylethylamine, diethyl-n-butylamine, methyldi-n-butylamine, methylethyl-n-butylamine, dodecyldimethylamine, tribenzylamine, triethanolamine, N,N-dimethylaniline, N,N-diethylaniline, diphenylmethylamine, pyridine, diethylcyclohexylamine, tricyclohexylamine, 1,4-diazabicyclo[2.2.2]octane, 1,8-diazabicyclo[5.4.0]-7-undecene, and 1,5-diazabicyclo[4.3.0]-5-nonene. Among these, because of solubility in water and because the target material is obtained with good yield, and so on, trimethylamine, triethylamine, tri-n-butylamine, and diisopropylethylamine are more preferred, and triethylamine is particularly preferred.

In the present embodiment, when a solvent is used when the modified naphthalene formaldehyde resin is cyanated, the total amount of the solvent is preferably 2.5 to 100 parts by mass based on 1 part by mass of the modified naphthalene formaldehyde resin from the viewpoint of uniformly dissolving the modified naphthalene formaldehyde resin and efficiently producing the cyanate ester compound.

In the present embodiment, when the modified naphthalene formaldehyde resin is cyanated, the pH of the reaction liquid is not particularly limited, but the reaction is preferably performed with a state of a pH of less than 7 maintained because by controlling the pH at less than 7, for example, the production of by-products such as imidocarbonates and a polymer of the cyanate ester compound is suppressed, and the cyanate ester compound can be efficiently produced. In order to maintain the state in which the pH of the reaction liquid is less than 7, a method of adding an acid is preferred. The method of adding an acid is not particularly limited, but, for example, adding an acid to the cyanogen halide solution immediately before cyanating the modified naphthalene formaldehyde resin, and adding an acid to the reaction system while appropriately measuring the pH by a pH meter during the reaction to maintain the state of a pH of less than 7 are preferred.

The acid used at this time is not particularly limited. Examples thereof include inorganic acids such as hydrochloric acid, nitric acid, sulfuric acid, and phosphoric acid, and organic acids such as acetic acid, lactic acid, and propionic acid.

In the present embodiment, the reaction temperature when the modified naphthalene formaldehyde resin is cyanated is preferably −20 to +50° C., more preferably −15 to 15° C., and further preferably −10 to 10° C. from the viewpoint of suppressing the production of by-products such as imidocarbonates, a polymer of the cyanate ester compound, and dialkylcyanoamides, the coagulation of the reaction liquid, and the volatilization of cyanogen chloride when using cyanogen chloride as the cyanogen halide.

In the present embodiment, the reaction pressure when the modified naphthalene formaldehyde resin is cyanated may be normal pressure or applied pressure. An inert gas such as nitrogen, helium, or argon may be passed through the system as required.

In addition, in the present embodiment, the reaction time when the modified naphthalene formaldehyde resin is cyanated is not particularly limited, but the pouring time when the above contact method is (A) and (B) and the contact time when the above contact method is (C) are each preferably 1 minute to 20 hours, more preferably 3 minutes to 10 hours. Further, it is preferred that then stirring is performed for 10 minutes to 10 hours while the reaction temperature is maintained. By setting the reaction time in such a range, the target cyanate ester compound is economically and industrially obtained.

In the present embodiment, the degree of the progress of the reaction when the modified naphthalene formaldehyde resin is cyanated can be analyzed by liquid chromatography, an IR spectrum method, or the like. Volatile components such as dicyan and dialkylcyanoamides produced as by-products can be analyzed by gas chromatography.

In the present embodiment, after the completion of the reaction of cyanating the modified naphthalene formaldehyde resin, the target cyanate ester compound can be isolated by performing the usual posttreatment operation, and separation and purification operations as desired. Specifically, the organic solvent layer comprising the cyanate ester compound should be fractionated from the reaction liquid, and water-washed followed by concentration, precipitation, or crystallization, or water-washed followed by solvent replacement. In washing, in order to remove the excess amine, a method using an acidic aqueous solution such as dilute hydrochloric acid is also adopted. In order to remove water from the sufficiently washed reaction liquid, a drying operation can be performed using a general method such as sodium sulfate or magnesium sulfate. In concentration and solvent replacement, in order to suppress the polymerization of the cyanate ester compound, it is preferred that heating to a temperature of 90° C. or lower under reduced pressure is performed to distill off the organic solvent. In precipitation or crystallization, a solvent having low solubility can be used. For example, a method of dropping an ether-based solvent, a hydrocarbon-based solvent such as hexane, or an alcohol-based solvent into the reaction solution or performing reverse pouring can be adopted. In order to wash the obtained crude product, a method of washing the concentrate of the reaction liquid or the precipitated crystals with an ether-based solvent, a hydrocarbon-based solvent such as hexane, or an alcohol-based solvent can be adopted. The crystals obtained by concentrating the reaction solution can also be dissolved again and then recrystallized. In addition, in the case of crystallization, crystallization may be performed by simply concentrating or cooling the reaction liquid.

The cyanate ester compound obtained by the above production method is not particularly limited. Examples thereof include a cyanate ester compound represented by the following general formula (1):

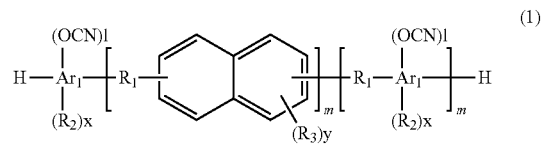

wherein Ar₁ represents an aromatic ring, R₁ each independently represents a methylene group, a methyleneoxy group, a methyleneoxymethylene group, or an oxymethylene group, and the methylene group, the methyleneoxy group, the methyleneoxymethylene group, and the oxymethylene group may be linked; R₂ represents a monovalent substituent and each independently represents a hydrogen atom, an alkyl group, or an aryl group, R₃ each independently represents a hydrogen atom, an alkyl group having 1 to 3 carbon atoms, an aryl group, a hydroxy group, or a hydroxymethylene group, m represents an integer of 1 or more, and n represents an integer of 0 or more; the cyanate ester compound may be a mixture of compounds having different m and n; l represents the number of bonded cyanato groups and is an integer of 1 to 3; x represents the number of bonded R₂ and is "the number of possible bonds of Ar₁-(l+2);" and y represents an integer of 0 to 4.

With the cyanate ester compound represented by the above general formula (1), a hardened product of a single cyanate ester compound having flame retardancy, low water-absorbing property, moisture absorption and heat resistance properties, heat resistance, low thermal expansion, and the like tends to be obtained.

In the above general formula (1), the arrangement of the repeating units is arbitrary. In other words, the compound represented by formula (1) may be a random copolymer or a block copolymer. The upper limit value of m is preferably 50 or less, more preferably 20 or less. The upper limit value of n is preferably 20 or less.

As a specific illustration, by reacting a modified naphthalene formaldehyde resin represented by the above general formulas (10) to (16) and a cyanogen halide in a solvent in the presence of a basic compound, a cyanate ester (mixture) comprising compounds represented by the following general formulas (18) to (24) as typical compositions can be obtained.

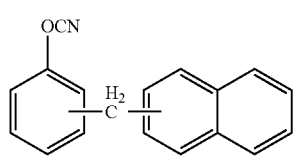

(18)

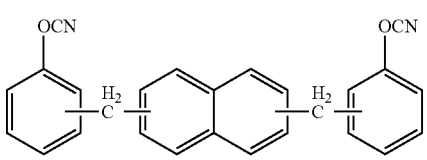

(19)

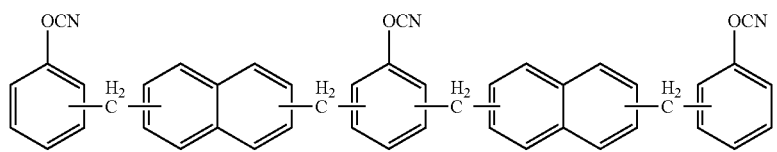

(20)

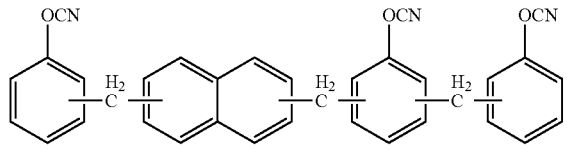

(21)

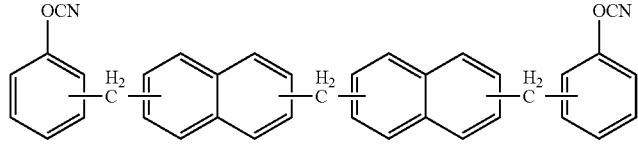

(22)

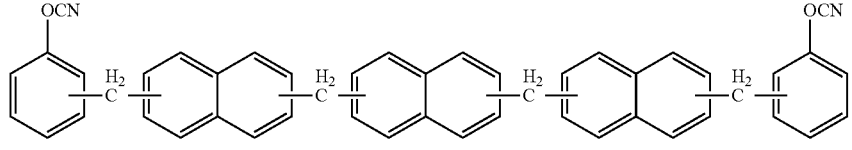

(23)

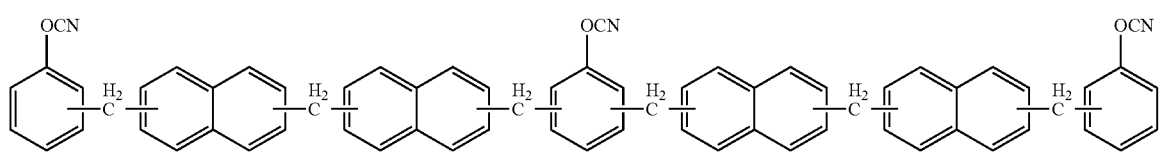

(24)

The weight average molecular weight Mw of the cyanate ester compound of the present embodiment is not particularly limited but is preferably 200 to 25000, more preferably 250 to 20000, and further preferably 300 to 15000. In the present embodiment, the weight average molecular weight Mw of the cyanate ester compound can be measured by a method described in Examples described later.

The identification of the obtained cyanate ester compound can be performed by a known method such as NMR. The purity of the cyanate ester compound can be analyzed by liquid chromatography, an IR spectrum method, or the like. Volatile components such as by-products such as dialkylcyanoamides in the cyanate ester compound and the remaining solvent can be quantitatively analyzed by gas chromatography. The halogen compound remaining in the cyanate ester compound can be identified by a liquid chromatograph mass spectrometer and can be quantitatively analyzed by potentiometric titration using a silver nitrate solution or ion chromatography after decomposition by a combustion method. The polymerization reactivity of the cyanate ester compound can be evaluated by gelation time by a hot plate method or a torque measuring method.

<<Curable Resin Composition>>

The curable resin composition of the present embodiment comprises the above-described cyanate ester compound. In the curable resin composition of the present embodiment, the content of the above-described cyanate ester compound is preferably 1 to 100 parts by mass, more preferably 3 to 90 parts by mass, and further preferably 5 to 80 parts by mass based on 100 parts by mass of a resin solid in the resin composition. Here, "a resin solid in the resin composition" refers to components in the resin composition excluding the solvent and the inorganic filler unless otherwise noted. In addition, "100 parts by mass of the resin solid" refers to the total of the components in the resin composition excluding the solvent and the inorganic filler being 100 parts by mass.

When the curable resin composition of the present embodiment comprises the above-described cyanate ester compound in the above range, a hardened product having a low coefficient of thermal expansion and excellent flame retardancy can be obtained.

In addition, the curable resin composition of the present embodiment may further contain at least one selected from the group consisting of a cyanate ester compound other than the above-described cyanate ester compound (hereinafter also referred to as "another cyanate ester compound"), an epoxy resin, an oxetane resin, a benzoxazine compound, and a compound having a polymerizable unsaturated group in a range in which the expected characteristics are not impaired.

The another cyanate ester compound is not particularly limited as long as it is a compound having an aromatic moiety substituted by at least one cyanato group in the molecule. Examples thereof include a cyanate ester compound represented by general formula (25):

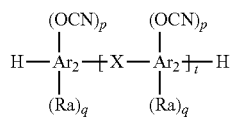

(25)

wherein $Ar_2$ represents a phenylene group, a naphthylene group, or a biphenylene group; Ra each independently represents a hydrogen atom, an alkyl group having 1 to 6 carbon atoms, an aryl group having 6 to 12 carbon atoms, an alkoxy group having 1 to 4 carbon atoms, or a group in which an alkyl group having 1 to 6 carbon atoms and an aryl group having 6 to 12 carbon atoms are mixed; any position can be selected for the substituents on the aromatic ring; p represents the number of bonded cyanato groups and is each independently an integer of 1 to 3; q represents the number of bonded Ra and is 4-p when $Ar_e$ is a phenylene group, 6-p when $Ar_2$ is a naphthylene group, and 8-p when $Ar_2$ is a biphenylene group; t represents an integer of 0 to 50, and the cyanate ester compound may be a mixture of compounds having different t; and X represents any of a single bond, a divalent organic group having 1 to 20 carbon atoms (a hydrogen atom may be replaced by a heteroatom), a divalent organic group having 1 to 10 nitrogen atoms (—N—R—N— or the like wherein R represents an organic group), a carbonyl group (—CO—), a carboxy group (—C(=O)O—), a carbonyl dioxide group (—OC(=O)O—), a sulfonyl group (—SO$_2$—), and a divalent sulfur atom or oxygen atom.

The alkyl group for Ra in general formula (25) may have either a chain structure or a cyclic structure (a cycloalkyl group or the like).

In addition, a hydrogen atom in the alkyl group in general formula (25) and the aryl group for Ra may be replaced by a halogen atom such as fluorine or chlorine, an alkoxy group such as a methoxy group or a phenoxy group, a cyano group, or the like.

Specific examples of the above alkyl group are not particularly limited and include a methyl group, an ethyl group, a propyl group, an isopropyl group, a n-butyl group, an isobutyl group, a tert-butyl group, a n-pentyl group, a 1-ethylpropyl group, a 2,2-dimethylpropyl group, a cyclopentyl group, a hexyl group, a cyclohexyl group, and a trifluoromethyl group.

Specific examples of the above aryl group are not particularly limited and include a phenyl group, a xylyl group, a mesityl group, a naphthyl group, a phenoxyphenyl group, an ethylphenyl group, an o-, m-, or p-fluorophenyl group, a dichlorophenyl group, a dicyanophenyl group, a trifluorophenyl group, a methoxyphenyl group, and an o-, m-, or p-tolyl group. Further, examples of the alkoxy group include a methoxy group, an ethoxy group, a propoxy group, an isopropoxy group, a n-butoxy group, an isobutoxy group, and a tert-butoxy group.

Specific examples of the divalent organic group for X in general formula (25) are not particularly limited and include a methylene group, an ethylene group, a trimethylene group, a propylene group, a cyclopentylene group, a cyclohexylene group, a trimethylcyclohexylene group, a biphenylylmethylene group, a dimethylmethylene-phenylene-dimethylmethylene group, a fluorenediyl group, and a phthalidediyl group. A hydrogen atom in the divalent organic group may be replaced by a halogen atom such as fluorine or chlorine, an alkoxy group such as a methoxy group or a phenoxy group, a cyano group, or the like.

The divalent organic group having 1 to 10 nitrogen atoms for X in general formula (25) is not particularly limited. Examples thereof include an imino group and a polyimide group.

In addition, X in general formula (25) is not particularly limited. Examples thereof include a structure represented by the following general formula (26) or structures represented by the following formulas.

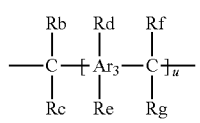

(26)

wherein $Ar_3$ represents a phenylene group, a naphthylene group, or a biphenylene group; Rb, Rc, Rf, and Rg each independently represent a hydrogen atom, an alkyl group having 1 to 6 carbon atoms, an aryl group having 6 to 12 carbon atoms, a trifluoromethyl group, or an aryl group substituted by at least one phenolic hydroxy group; Rd and Re each independently represent a hydrogen atom, an alkyl group having 1 to 6 carbon atoms, an aryl group having 6 to 12 carbon atoms, an alkoxy group having 1 to 4 carbon atoms, or a hydroxy group; and u represents an integer of 0 to 5 and may be the same or different.

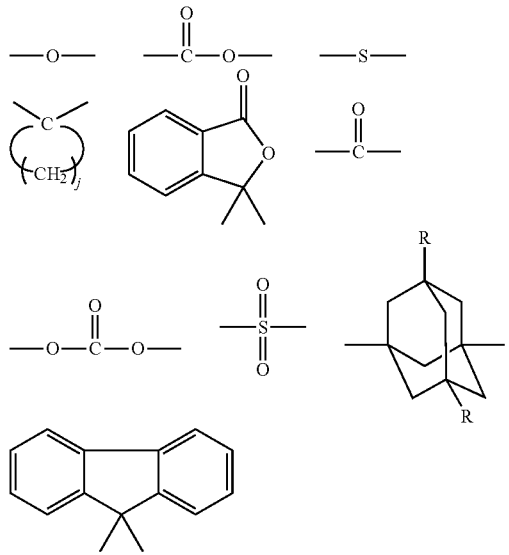

wherein j represents an integer of 4 to 7; and R each independently represents a hydrogen atom or an alkyl group having 1 to 6 carbon atoms.

Specific examples of $Ar_3$ in general formula (26) are not particularly limited and include a 1,4-phenylene group, a 1,3-phenylene group, a 4,4'-biphenylene group, a 2,4'-biphenylene group, a 2,2'-biphenylene group, a 2,3'-biphenylene group, a 3,3'-biphenylene group, a 3,4'-biphenylene group, a 2,6-naphthylene group, a 1,5-naphthylene group, a 1,6-naphthylene group, a 1,8-naphthylene group, a 1,3-naphthylene group, and a 1,4-naphthylene group.

The alkyl group and the aryl group for Rb to Rf in general formula (26) are similar to those described in general formula (25).

Specific examples of the cyanato-substituted aromatic compound represented by general formula (25) include cyanatobenzene, 1-cyanato-2-, 1-cyanato-3-, or 1-cyanato-4-methylbenzene, 1-cyanato-2-, 1-cyanato-3-, or 1-cyanato-4-methoxybenzene, 1-cyanato-2,3-, 1-cyanato-2,4-, 1-cyanato-2,5-, 1-cyanato-2,6-, 1-cyanato-3,4-, or 1-cyanato-3,5-dimethylbenzene, cyanatoethylbenzene, cyanatobutylbenzene, cyanatooctylbenzene, cyanatononylbenzene, 2-(4-cyanatophenyl)-2-phenylpropane (a cyanate ester of 4-α-cumylphenol), 1-cyanato-4-cyclohexylbenzene, 1-cyanato-4-vinylbenzene, 1-cyanato-2- or 1-cyanato-3-chlorobenzene, 1-cyanato-2,6-dichlorobenzene, 1-cyanato-2-methyl-3-chlorobenzene, cyanatonitrobenzene, 1-cyanato-4-nitro-2-ethylbenzene, 1-cyanato-2-methoxy-4-allylbenzene (a cyanate ester of eugenol), methyl(4-cyanatophenyl)sulfide, 1-cyanato-3-trifluoromethylbenzene, 4-cyanatobiphenyl, 1-cyanato-2- or 1-cyanato-4-acetylbenzene, 4-cyanatobenzaldehyde, methyl 4-cyanatobenzoate ester, phenyl 4-cyanatobenzoate ester, 1-cyanato-4-acetaminobenzene, 4-cyanatobenzophenone, 1-cyanato-2,6-di-tert-butylbenzene, 1,2-dicyanatobenzene, 1,3-dicyanatobenzene, 1,4-dicyanatobenzene, 1,4-dicyanato-2-tert-butylbenzene, 1,4-dicyanato-2,4-dimethylbenzene, 1,4-dicyanato-2,3,4-dimethylbenzene, 1,3-dicyanato-2,4,6-trimethylbenzene, 1,3-dicyanato-5-methylbenzene, 1-cyanato- or 2-cyanatonaphthalene, 1-cyanato4-methoxynaphthalene, 2-cyanato-6-methylnaphthalene, 2-cyanato-7-methoxynaphthalene, 2,2'-dicyanato-1,1'-binaphthyl, 1,3-, 1,4-, 1,5-, 1,6-, 1,7-, 2,3-, 2,6-, or 2,7-dicyanatonaphthalene, 2,2'- or 4,4'-dicyanatobiphenyl, 4,4'-dicyanatooctafluorobiphenyl, 2,4'- or 4,4'-dicyanatodiphenylmethane, bis(4-cyanato-3,5-dimethylphenyl)methane, 1,1-bis(4-cyanatophenyl)ethane, 1,1-bis(4-cyanatophenyl)propane, 2,2-bis(4-cyanatophenyl)propane, 2,2-bis(4-cyanato-3-methylphenyl)propane, 2,2-bis(2-cyanato-5-biphenylyl)propane, 2,2-bis(4-cyanatophenyl)hexafluoropropane, 2,2-bis(4-cyanato-3,5-dimethylphenyl)propane, 1,1-bis(4-cyanatophenyl)butane, 1,1-bis(4-cyanatophenyl)isobutane, 1,1-bis(4-cyanatophenyl)pentane, 1,1-bis(4-cyanatophenyl)-3-methylbutane, 1,1-bis(4-cyanatophenyl)-2-methylbutane, 1,1-bis(4-cyanatophenyl)-2,2-dimethylpropane, 2,2-bis(4-cyanatophenyl)butane, 2,2-bis(4-cyanatophenyl)pentane, 2,2-bis(4-cyanatophenyl)hexane, 2,2-bis(4-cyanatophenyl)-3-methylbutane, 2,2-bis(4-cyanatophenyl)-4-methylpentane, 2,2-bis(4-cyanatophenyl)-3,3-dimethylbutane, 3,3-bis(4-cyanatophenyl)hexane, 3,3-bis(4-cyanatophenyl)heptane, 3,3-bis(4-cyanatophenyl)octane, 3,3-bis(4-cyanatophenyl)-2-methylpentane, 3,3-bis(4-cyanatophenyl)-2-methylhexane, 3,3-bis(4-cyanatophenyl)-2,2-dimethylpentane, 4,4-bis(4-cyanatophenyl)-3-methylheptane, 3,3-bis(4-cyanatophenyl)-2-methylheptane, 3,3-bis(4-cyanatophenyl)-2,2-dimethylhexane, 3,3-bis(4-cyanatophenyl)-2,4-dimethylhexane, 3,3-bis(4-cyanatophenyl)-2,2,4-trimethylpentane, 2,2-bis(4-cyanatophenyl)-1,1,1,3,3,3-hexafluoropropane, bis(4-cyanatophenyl)phenylmethane, 1,1-bis(4-cyanatophenyl)-1-phenylethane, bis(4-cyanatophenyl)biphenylmethane, 1,1-bis(4-cyanatophenyl)cyclopentane, 1,1-bis(4-cyanatophenyl)cyclohexane, 2,2-bis(4-cyanato-3-isopropylphenyl)propane, 1,1-bis(3-cyclohexyl-4-cyanatophenyl)cyclohexane, bis(4-cyanatophenyl)diphenylmethane, bis(4-cyanatophenyl)-2,2-dichloroethylene, 1,3-bis[2-(4-cyanatophenyl)-2-propyl]benzene, 1,4-bis[2-(4-cyanatophenyl)-2-propyl]benzene, 1,1-bis(4-cyanatophenyl)-3,3,5-trimethylcyclohexane, 4-[bis(4-cyanatophenyl)methyl]biphenyl, 4,4-dicyanatobenzophenone, 1,3-bis(4-cyanatophenyl)-2-propen-1-one, bis(4-cyanatophenyl)ether, bis(4-cyanatophenyl)sulfide, bis(4-cyanatophenyl)sulfone, 4-cyanatobenzoic acid-4-cyanatophenyl ester (4-cyanatophenyl-4-cyanatobenzoate), bis-(4-cyanatophenyl)carbonate, 1,3-bis(4-cyanatophenyl)adamantane, 1,3-bis(4-cyanatophenyl)-5,7-dimethyladamantane, 3,3-bis(4-cyanatophenyl)isobenzofuran-1(3H)-one (a cyanate ester of phenolphthalein), 3,3-bis(4-cyanato-3-methylphenyl)isobenzofuran-1(3H)-one (a cyanate ester of o-cresolphthalein), 9,9'-bis(4-cyanatophenyl)fluorene, 9,9-bis(4-cyanato-3-methylphenyl)fluorene, 9,9-bis(2-cyanato-5-biphenylyl)fluorene, tris(4-cyanatophenyl)methane, 1,1,1-tris(4-cyanatophenyl)ethane, 1,1,3-tris(4-cyanatophenyl)propane, α,α,α'-tris(4-cyanatophenyl)-1-ethyl-4-isopropylbenzene, 1,1,2,2-tetrakis(4-cyanatophenyl)ethane, tetrakis(4-cyanatophenyl)methane, 2,4,6-tris(N-methyl-4-cyanatoanilino)-1,3,5-triazine, 2,4-bis(N-methyl-4-cyanatoanilino)-6-(N-methylanilino)-1,3,5-triazine, bis(N-4-cyanato-2-methylphenyl)-4,4'-oxydiphthalimide, bis(N-3-cyanato-4-methylphenyl)-4,4'-oxydiphthalimide, bis(N-4-cyanatophenyl)-4,4'-oxydiphthalimide, bis(N-4-cyanato-2-methylphenyl)-4,4'-(hexafluoroisopropylidene) diphthalimide, tris(3,5-dimethyl-4-cyanatobenzyl) isocyanurate, 2-phenyl-3,3-bis(4-cyanatophenyl) phthalimidine, 2-(4-methylphenyl)-3,3-bis(4- cyanatophenyl)phthalimidine, 2-phenyl-3,3-bis(4-cyanato-3-methylphenyl)phthalimidine, 1-methyl-3,3-bis(4-cyanatophenyl)indolin-2-one, 2-phenyl-3,3-bis(4-cyanatophenyl)indolin-2-one, and products obtained by cyanating phenolic resins such as phenol novolac resins and cresol novolac resins (those obtained by reacting a phenol, an alkyl-substituted phenol, or a halogen-substituted phenol and a formaldehyde compound such as formalin or paraformaldehyde in an acidic solution by a known method), phenol aralkyl resins, cresol aralkyl resins, naphthol aralkyl resins, and biphenyl aralkyl resins (those obtained by reacting a bishalogenomethyl compound as represented by $Ar_3$—$(CH_2Y)_2$ and a phenol compound with an acidic catalyst or without a catalyst by a known method, and those obtained by reacting a bis(alkoxymethyl) compound as represented by $Ar_3$—$(CH_2OR)_2$ or a bis(hydroxymethyl) compound as represented by $Ar_3$—$(CH_2OH)_2$ and a phenol compound in the presence of an acidic catalyst by a known method), phenol-modified xylene formaldehyde resins (those obtained by reacting a xylene formaldehyde resin and a phenol compound in the presence of an acidic catalyst by a known method), and phenol-modified dicyclopentadiene resins by a method similar to the above, but are not particularly limited. One of these cyanate ester compounds can be used, or two or more of these cyanate ester compounds can be mixed and used.

As the epoxy resin, those generally known can be used as long as they are compounds having two or more epoxy groups in one molecule. Specific examples of the epoxy resin are not particularly limited and include bisphenol A-based epoxy resins, bisphenol E-based epoxy resins, bisphenol F-based epoxy resins, bisphenol S-based epoxy resins, bisphenol A novolac-based epoxy resins, biphenyl-based epoxy resins, phenol novolac-based epoxy resins, cresol novolac-based epoxy resins, xylene novolac-based epoxy resins, naphthalene-based epoxy resins, anthracene-based epoxy resins, trifunctional phenol-based epoxy resins, tetrafunctional phenol-based epoxy resins, triglycidyl isocyanurate, glycidyl ester-based epoxy resins, alicyclic epoxy resins, dicyclopentadiene novolac-based epoxy resins, biphenyl novolac-based epoxy resins, phenol aralkyl novolac-based epoxy resins, naphthol aralkyl novolac-based epoxy resins, aralkyl novolac-based epoxy resins, biphenyl aralkyl-based epoxy resins, naphthol aralkyl-based epoxy resins, dicyclopentadiene-based epoxy resins, polyol-based epoxy resins, alicyclic epoxy resins, or halides thereof. One of these epoxy resins can be used, or two or more of these epoxy resins can be mixed and used.

As the oxetane resin, those generally known can be used. Specific examples of the oxetane resin are not particularly limited and include oxetane, alkyloxetanes such as 2-methyloxetane, 2,2-dimethyloxetane, 3-methyloxetane, and 3,3-dimethyloxetane, 3-methyl-3-methoxymethyloxetane, 3,3'-di(trifluoromethyl)perfluoxetane, 2-chloromethyloxetane, 3,3-bis(chloromethyl)oxetane, OXT-101 (trade name manufactured by Toagosei Co., Ltd.), and OXT-121 (trade name manufactured by Toagosei Co., Ltd.). One of these oxetane resins can be used, or two or more of these oxetane resins can be mixed and used.

As the benzoxazine compound, those generally known can be used as long as they are compounds having two or more dihydrobenzoxazine rings in one molecule. Specific examples of the benzoxazine compound are not particularly limited and include bisphenol A-based benzoxazine BA-BXZ (trade name manufactured by Konishi Chemical Ind. Co., Ltd.), bisphenol F-based benzoxazine BF-BXZ (trade name manufactured by Konishi Chemical Ind. Co., Ltd.), and bisphenol S-based benzoxazine BS-BXZ (trade name manufactured by Konishi Chemical Ind. Co., Ltd.). One of these benzoxazine compounds can be used, or two or more of these benzoxazine compounds can be mixed and used.

As the compound having a polymerizable unsaturated group, those generally known can be used. Specific examples of the compound having a polymerizable unsaturated group are not particularly limited and include vinyl compounds such as ethylene, propylene, styrene, divinylbenzene, and divinylbiphenyl, (meth)acrylates of monohydric or polyhydric alcohols such as methyl(meth)acrylate, 2-hydroxyethyl(meth)acrylate, 2-hydroxypropyl(meth)acrylate, polypropylene glycol di(meth)acrylate, trimethylolpropane di(meth)acrylate, trimethylolpropane tri(meth)acrylate, pentaerythritol tetra(meth)acrylate, and dipentaerythritol hexa(meth)acrylate, epoxy(meth)acrylates such as bisphenol A-based epoxy(meth)acrylate and bisphenol F-based epoxy (meth)acrylate, benzocyclobutene resins, and (bis)maleimide resins. One of these compounds having an unsaturated group can be used, or two or more of these compounds having an unsaturated group can be mixed and used.

In addition to the above-described compounds or resins, a compound that catalyzes the polymerization of the cyanate, the epoxy resin, the oxetane resin, or the compound having a polymerizable unsaturated group (polymerization catalyst) can be further blended in the curable resin composition of the present embodiment. The polymerization catalyst is not particularly limited. Examples thereof include metal salts such as zinc octylate, zinc naphthenate, cobalt naphthenate, copper naphthenate, and acetylacetone iron, phenol compounds such as octyl phenol and nonyl phenol, alcohols such as 1-butanol and 2-ethylhexanol, imidazole derivatives such as 2-methylimidazole, 2-ethyl-4-methylimidazole, 2-phenylimidazole, 1-cyanoethyl-2-phenylimidazole, 1-cyanoethyl-2-ethyl-4-methylimidazole, 2-phenyl-4,5-dihydroxymethylimidazole, and 2-phenyl-4-methyl-5-hydroxymethylimidazole, amine compounds such as dicyandiamide, benzyldimethylamine, and 4-methyl-N,N-dimethylbenzylamine, and phosphine-based or phosphonium-based phosphorus compounds. In addition, an epoxy-imidazole adduct-based compound, a peroxide such as benzoyl peroxide, p-chlorobenzoyl peroxide, di-t-butyl peroxide, diisopropyl peroxycarbonate, or di-2-ethylhexyl peroxycarbonate, an azo compound such as azobisisobutyronitrile, or the like may be used. For these catalysts, commercial ones may be used and are not particularly limited. Examples thereof include AJICURE PN-23 (manufactured by Ajinomoto Fine-Techno Co., Inc.), NOVACURE HX-3721 (manufactured by Asahi Kasei Corporation), and Fujicure FX-1000 (manufactured by FUJI KASEI KOGYO CO., LTD.). One of these catalysts can be used, or two or more of these catalysts can be mixed and used.

Further, the curable resin composition of the present embodiment may contain known additives such as a thermoplastic resin, an inorganic filler, a curing catalyst, a curing accelerator, a coloring pigment, a defoaming agent, a surface adjusting agent, a flame retardant, an ultraviolet absorbing agent, an antioxidant, a photopolymerization initiator, a fluorescent brightening agent, a photosensitizer, a dye, a pigment, a thickening agent, a lubricant, a flow adjusting agent, a dispersing agent, a leveling agent, a brightening agent, a polymerization inhibitor, and a silane coupling agent as required. In addition, the curable resin composition may contain a solvent as required. One of these optional additives can be used, or two or more of these optional additives can be mixed and used.

As the inorganic filler, those generally known can be used. Specific examples of the inorganic filler are not particularly limited and include silicates such as talc, calcined clay, uncalcined clay, mica, E glass, A glass, NE glass, C glass, L glass, D glass, S glass, M glass G20, glass short fibers (including fine powders of glass such as E glass, T glass, D glass, S glass, and Q glass), hollow glass, and spherical glass, oxides such as titanium oxide, alumina, silica, fused silica, zinc oxide, magnesium oxide, zirconium oxide, and molybdenum oxide, carbonates such as calcium carbonate, magnesium carbonate, and hydrotalcite, hydroxides such as aluminum hydroxide, magnesium hydroxide, and calcium hydroxide, sulfates or sulfites such as barium sulfate, calcium sulfate, and calcium sulfite, borates such as zinc borate, barium metaborate, aluminum borate, calcium borate, and sodium borate, nitrides such as aluminum nitride, boron nitride, silicon nitride, and carbon nitride, titanates such as strontium titanate and barium titanate, boehmite, zinc molybdate, silicone composite powders, and silicone resin powders. One of these inorganic fillers can be used, or two or more of these inorganic fillers can be mixed and used.

As the solvent, those generally known can be used. Specific examples of the solvent are not particularly limited and include ketone-based solvents such as acetone, methyl ethyl ketone, methyl isobutyl ketone, and cyclohexanone, cellosolve-based solvents such as propylene glycol monomethyl ether and propylene glycol monomethyl ether acetate, ester-based solvents such as ethyl lactate, methyl acetate, ethyl acetate, butyl acetate, isoamyl acetate, ethyl lactate, methyl methoxypropionate, and methyl hydroxyisobutyrate, alcohol-based solvents such as methanol, ethanol, isopropanol, and 1-ethoxy-2-propanol, and aromatic hydrocarbons such as toluene, xylene, and anisole. One of these solvents can be used, or two or more of these solvents can be mixed and used.

The curable resin composition of the present embodiment can be obtained, for example, by mixing the above-described cyanate ester compound, and another cyanate ester compound, an epoxy resin, an oxetane resin, a benzoxazine compound, and/or a compound having a polymerizable unsaturated group and various additives as required together with a solvent using a known mixer, for example, a high speed mixer, a Nauta mixer, a ribbon-based blender, a kneader, an intensive mixer, a universal mixer, a dissolver, or a static mixer, though not particularly limited. The method for adding the cyanate ester compound, the various additives, and the solvent in mixing is not particularly limited.

The curable resin composition of the present embodiment can be hardened by heat, light, or the like to provide a hardened product. The hardened product of the present embodiment can be obtained, for example, by melting the above-described curable resin composition or dissolving it in a solvent, then pouring the melt or the solution into a mold, and curing it under usual conditions. In the case of thermal curing, the curing temperature is preferably in the range of 120° C. to 300° C. because the curing does not proceed when the curing temperature is too low, and the deterioration of the hardened product occurs when the curing temperature is too high.

<Applications of Curable Resin Composition>

A prepreg of the present embodiment is obtained by impregnating or coating a base material with the above-described curable resin composition and drying the curable resin composition.

Specifically, for example, by impregnating or coating inorganic and/or organic fiber base materials with the above-described curable resin composition and drying the curable resin composition, the prepreg of the present embodiment can be produced.

The above base material is not particularly limited. Examples thereof include glass fiber base materials such as glass woven cloths and glass nonwoven cloths and organic fiber base materials such as synthetic fiber base materials composed of woven cloths or nonwoven cloths comprising as a main component polyamide-based resin fibers such as polyamide resin fibers, aromatic polyamide resin fibers, or wholly aromatic polyamide resin fibers, polyester-based resin fibers such as polyester resin fibers, aromatic polyester resin fibers, or wholly aromatic polyester resin fibers, polyimide resin fibers, fluororesin fibers, or the like, and paper base materials comprising as a main component kraft paper, cotton linter paper, mixed paper of linters and kraft pulp, or the like. These known ones can be appropriately selected and used according to the performance, for example, strength, water absorption rate, and coefficient of thermal expansion, required of the prepreg.

The glass constituting the above glass fiber base materials is not particularly limited. Examples thereof include E glass, C glass, A glass, S glass, D glass, NE glass, T glass, and H glass.

For the method for producing the prepreg of the present embodiment, a generally known method can be appropriately applied, and the method is not particularly limited. The prepreg of the present embodiment can be produced by applying, for example, a method of preparing a resin varnish using the above-described curable resin composition, and immersing a base material in the resin varnish, a method of coating by various coaters, or a method of spraying by a spray. Among these, the method of immersing a base material in a resin varnish is preferred. By this, the impregnation properties of the curable resin composition into a base material can be improved. When a base material is immersed in a resin varnish, usual impregnation and coating equipment can be used. For example, a method for producing a prepreg by impregnating inorganic and/or organic fiber base materials with a curable resin composition varnish, drying it, and B-staging it can be applied.

In addition, the curable resin composition of the present embodiment can also be used in metal-clad laminate and multilayer plate applications. For the methods for producing these laminates and the like, those generally known can be appropriately applied, and the methods are not particularly limited. For example, by laminating the above prepreg and metal foil and hot-pressing them, a laminate can be obtained. At this time, the heating temperature is not particularly limited but is usually preferably 65 to 300° C., more preferably 120 to 270° C. In addition, the applied pressure is not particularly limited but is usually preferably 2 to 5 MPa, more preferably 2.5 to 4 MPa.

Further, a sealing material can be produced using the curable resin composition of the present embodiment. For the method for producing a sealing material, a generally known one can be appropriately applied, and the method is not particularly limited. For example, by mixing the above-described curable resin composition and various additives known in sealing material applications, a solvent, or the like using a known mixer, a sealing material can be produced. For the method for adding a cyanate ester compound, various additives, and a solvent in mixing, a generally known one can be appropriately applied, and the method is not particularly limited.

In addition, a fiber-reinforced composite material can be produced using the curable resin composition of the present embodiment. As the reinforcing fibers, for example, fibers such as carbon fibers, glass fibers, aramid fibers, boron fibers, PBO fibers, high strength polyethylene fibers, alumina fibers, and silicon carbide fibers can be used though not particularly limited. The form and arrangement of the reinforcing fibers are not particularly limited and, for example, can be appropriately selected from woven fabrics, nonwoven cloths, mats, knits, braids, unidirectional strands, rovings, chopped, and the like. In addition, as the form of the reinforcing fibers, for example, a preform (a laminate of a woven foundation cloth comprising reinforcing fibers, or the laminate sewn and integrated by a stitching thread, or a fiber structure such as a three-dimensional woven fabric or braided fabric) can also be applied though not particularly limited. Specific examples of methods for producing these fiber-reinforced composite materials include liquid composite molding methods, resin film infusion methods, filament winding methods, hand lay-up methods, and pultrusion methods though not particularly limited. Among these, a resin transfer molding method, one of liquid composite molding methods, is preferably used when a composite material having a relatively complicated shape is mass-produced in a short time because the resin transfer molding method is adaptable to various applications because a material other than a preform such as a metal plate, a foam core, or a honeycomb core can be set in a mold in advance.

The curable resin composition of the present embodiment has excellent low thermal expansion properties, flame retardancy, and heat resistance and therefore is extremely useful as a highly functional polymer material and is preferably used, as a material having excellent thermal, electrical, and mechanical properties, for electrical insulating materials, sealing materials, adhesives, lamination materials, resists, and buildup laminate materials as well as fixing materials, structural members, reinforcing agents, casting materials, and the like in civil engineering and construction, electric and electronic, automobile, railroad, ship, aircraft, sporting goods, and arts and crafts fields and the like. Among these, the curable resin composition of the present embodiment is preferred for electrical insulating materials, semiconductor sealing materials, adhesives for electronic components, aircraft structural members, satellite structural members, and railroad car structural members of which low thermal expansion properties, flame resistance, and a high degree of mechanical strength are required.

EXAMPLES

The present invention will be described in more detail below by Examples. However, the present invention is not particularly limited by the following Examples.
(Measurement of Weight Average Molecular Weight Mw of Cyanate Ester Compound)

10 μL of a solution of 1 g of a cyanate ester compound dissolved in 100 g of tetrahydrofuran (solvent) was injected into high performance liquid chromatography (high performance liquid chromatograph LachromElite manufactured by Hitachi High-Technologies Corporation) and analyzed. The columns were two of TSKgel $GMH_{HR}$-M (length 30 cm×inner diameter 7.8 mm) manufactured by Tosoh Corporation, the mobile phase was tetrahydrofuran, the flow rate was 1 mL/min., and the detector was RI. The weight average molecular weight Mw of the cyanate ester compound was obtained by a GPC method using polystyrene as a standard substance.

(Example 1) Synthesis of Cyanate Ester Compound of Phenol-Modified Naphthalene Formaldehyde Resin (Cyanate Ester Compound of Following Formula (1a) (Having Following Formula (27) as Typical Compositions): Hereinafter Also Abbreviated as "NMCN")

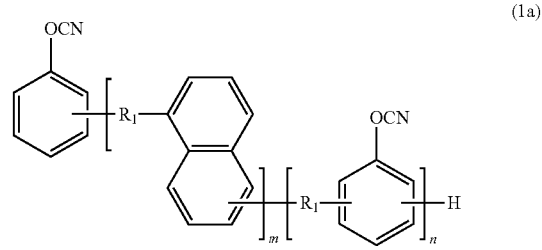

(1a)

wherein $R_1$, m, and n have the same meanings as described in the above-described formula (1).

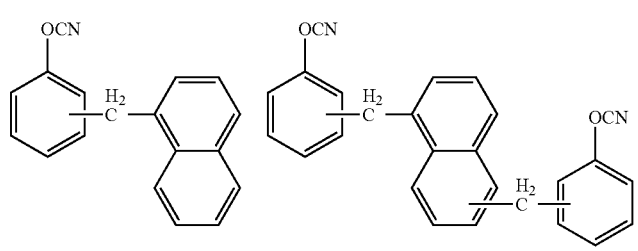

(27)

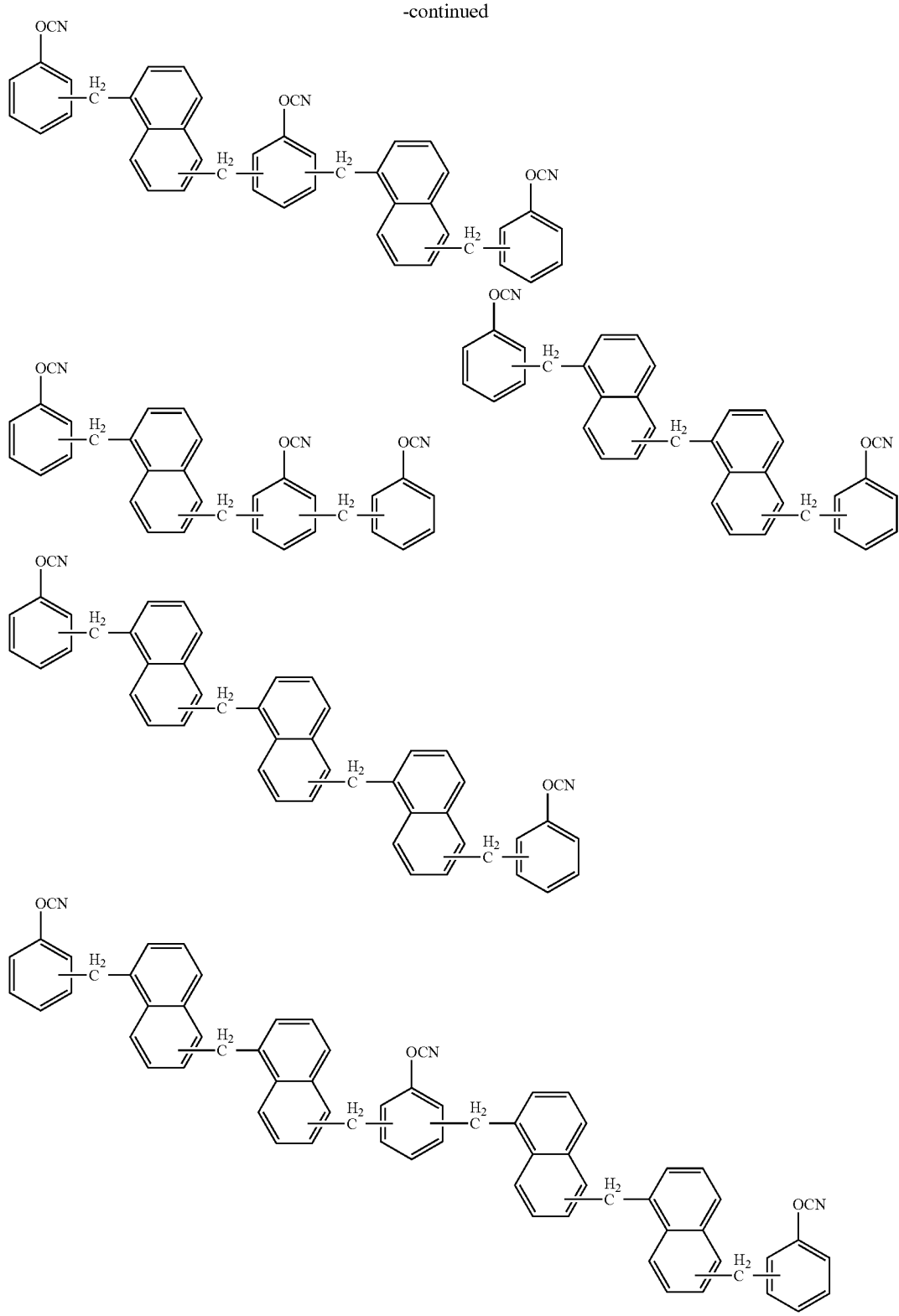

<Synthesis of Naphthalene Formaldehyde Resin>

681 g of a 37% by mass aqueous solution of formalin (8.4 mol of formaldehyde, manufactured by MITSUBISHI GAS CHEMICAL COMPANY, INC.) and 338 g of 98% by mass sulfuric acid (manufactured by MITSUBISHI GAS CHEMICAL COMPANY, INC.) were stirred under reflux under normal pressure around 100° C. 295 g of molten 1-naphthalenemethanol (1.9 mol, manufactured by TOKYO CHEMICAL INDUSTRY CO., LTD.) was dropped thereinto over 4 hours, and then the mixture was further reacted for 2 hours. 580 g ethylbenzene (manufactured by Wako Pure Chemical Industries, Ltd.) and 460 g of methyl isobutyl ketone (manufactured by Wako Pure Chemical Industries, Ltd.) as diluent solvents were added to the obtained reaction liquid, and the reaction liquid was left at rest. Then, the aqueous phase, the lower phase, was removed. Further, the reaction liquid was neutralized and water-washed, and the ethylbenzene and the methyl isobutyl ketone were distilled off under reduced pressure to obtain 332 g of a naphthalene formaldehyde resin, a pale yellow solid.

<Synthesis of Phenol-Modified Naphthalene Formaldehyde Resin>

305 g of the naphthalene formaldehyde resin obtained above (the number of moles of contained oxygen 2.3 mol) and 536 g of phenol (5.7 mol, manufactured by Wako Pure Chemical Industries, Ltd.) were heated and melted at 100° C., and then 340 mg of para-toluenesulfonic acid (manufactured by Wako Pure Chemical Industries, Ltd.) was added with stirring to start a reaction. While the temperature was raised to 160° C., the mixture was reacted for 2 hours. The obtained reaction liquid was diluted with 1200 g of a mixed solvent (meta-xylene (manufactured by MITSUBISHI GAS CHEMICAL COMPANY, INC.)/methyl isobutyl ketone (manufactured by Wako Pure Chemical Industries, Ltd.)=1/1 (mass ratio)) and then neutralized and water-washed, and the solvent and the unreacted raw materials were removed under reduced pressure to obtain 550 g of a phenol-modified naphthalene formaldehyde resin, a blackish brown solid, represented by the following formula (9a). The OH value of the obtained phenol-modified naphthalene formaldehyde resin was 295 mg KOH/g (the OH group equivalent was 190 g/eq.).

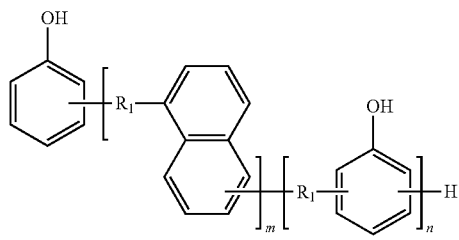

(9a)

wherein $R_1$, m, and n have the same meanings as described in the above-described formula (9).

<Synthesis of NMCN>

550 g of the phenol-modified naphthalene formaldehyde resin represented by formula (9a) obtained by the above method (OH group equivalent 190 g/eq.) (2.90 mol in terms of OH groups) (weight average molecular weight Mw 600) and 439.8 g (4.35 mol) (1.5 mol based on 1 mol of hydroxy groups) of triethylamine were dissolved in 3090 g of dichloromethane, and this solution was a solution 1.

While 285.0 g (4.64 mol) (1.6 mol based on 1 mol of hydroxy groups) of cyanogen chloride, 665.0 g of dichloromethane, 440.2 g (4.35 mol) (1.5 mol based on 1 mol of hydroxy groups) of 36% hydrochloric acid, and 2729.1 g of water were maintained at a liquid temperature of −2 to −0.5° C. under stirring, the solution 1 was poured over 55 minutes. After the completion of the pouring of the solution 1, the mixture was stirred at the same temperature for 30 minutes, and then a solution of 263.9 g (2.61 mol) (0.9 mol based on 1 mol of hydroxy groups) of triethylamine dissolved in 264 g of dichloromethane (solution 2) was poured over 30 minutes. After the completion of the pouring of the solution 2, the mixture was stirred at the same temperature for 30 minutes to complete the reaction.

Then, the reaction liquid was left at rest to separate the organic phase and the aqueous phase. The obtained organic phase was washed four times with 2000 g of water. The electrical conductivity of the wastewater from the fourth water washing was 20 µS/cm, and it was confirmed that removable ionic compounds were sufficiently removed by the washing with water.

The organic phase after the water washing was concentrated under reduced pressure and finally concentrated to dryness at 90° C. for 1 hour to obtain 592 g of the target cyanate ester compound NMCN (light yellow viscous material). The weight average molecular weight Mw of the obtained cyanate ester compound NMCN was 970. A GPC chart is shown in FIG. 1. In addition, the IR spectrum of the NMCN showed absorption at 2250 cm' (cyanate ester groups) and showed no absorption of hydroxy groups. An IR chart is shown in FIG. 2. It was possible to dissolve 50% by mass or more of the NMCN in methyl ethyl ethyl ketone at 25° C.

Example 2

Preparation of Curable Resin Composition and Making of Hardened Product 100 parts by mass of the cyanate ester compound NMCN obtained in Example 1 was introduced into an eggplant-based flask, heated and melted at 150° C., and degassed by a vacuum pump. Then, 0.05 parts by mass of zinc octylate (manufactured by Nihon Kagaku Sangyo Co., Ltd., trademark NIKKA OCTHIX Acid Zinc, metal content 18%) was added, and the flask was shaken for 1 minute for mixing to prepare a curable resin composition.

The obtained curable resin composition was poured into a mold made of an aluminum plate, copper foil, and fluorine-coated stainless steel, and the mold was placed in an oven. The resin was made uniform at 150° C., then hardened by a vacuum press at 20 kg/cm² at 220° C. for 90 minutes, and then further heated at 220° C. for 6 hours to obtain a hardened product having a side of 100 mm and a thickness of 1.5 mm.

(Example 3) Synthesis of Cyanate Ester Compound of Phenol-Modified Naphthalene Formaldehyde Resin (Cyanate Ester Compound of Following Formula (1b) (Having Following Formula (28) as Typical Compositions): Hereinafter Also Abbreviated as "NRCN")

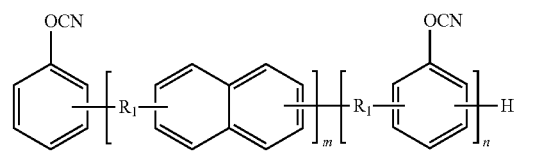

(1b)

wherein $R_1$, m, and n have the same meanings as described in the above-described formula (1).

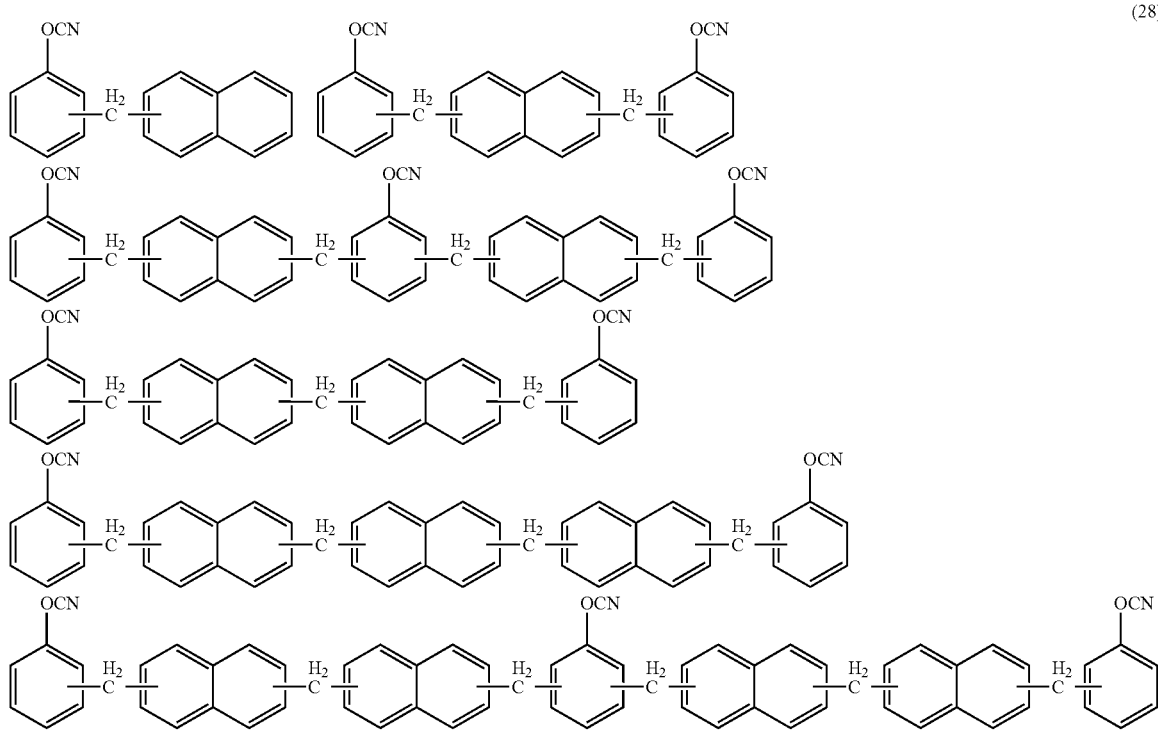

(28)

<Synthesis of Naphthalene Formaldehyde Resin>

3220 g of a 37% by mass aqueous solution of formalin (40 mol of formaldehyde, manufactured by MITSUBISHI GAS CHEMICAL COMPANY, INC.), 142 g of methanol (manufactured by MITSUBISHI GAS CHEMICAL COMPANY, INC.) and 1260 g of 98% by mass sulfuric acid (manufactured by MITSUBISHI GAS CHEMICAL COMPANY, INC.) were stirred under reflux under normal pressure around 100° C. 640 g of molten naphthalene (5.0 mol, manufactured by KANTO CHEMICAL CO., INC.) was dropped thereinto over 6 hours, and then the mixture was further reacted for 2 hours. 630 g ethylbenzene (manufactured by Wako Pure Chemical Industries, Ltd.) and 630 g of methyl isobutyl ketone (manufactured by Wako Pure Chemical Industries, Ltd.) as diluent solvents were added to the obtained reaction liquid, and the reaction liquid was left at rest. Then, the aqueous phase, the lower phase, was removed. Further, the reaction liquid was neutralized and water-washed, and the ethylbenzene and the methyl isobutyl ketone were distilled off under reduced pressure to obtain 816 g of a naphthalene formaldehyde resin, a pale yellow solid.

<Synthesis of Acetal Bond-Removed Naphthalene Formaldehyde Resin>

500 g of the naphthalene formaldehyde resin obtained above was melted at 120° C., and then 10 mg of para-toluenesulfonic acid (manufactured by Wako Pure Chemical Industries, Ltd.) was added under a steam flow with stirring, and the temperature was raised to 190° C. in 1 hour. Then, the mixture was further reacted for 4 hours (a total of 5 hours). The obtained reaction liquid was diluted with 500 g of ethylbenzene (manufactured by KANTO CHEMICAL CO., INC.) and then neutralized and water-washed, and the solvent was removed under reduced pressure to obtain 380 g of an acetal bond-removed naphthalene formaldehyde resin, a light-red solid.

<Synthesis of Phenol-Modified Naphthalene Formaldehyde Resin>

584 g of phenol (6.2 mol, manufactured by Wako Pure Chemical Industries, Ltd.) was heated and melted at 100° C., and then 110 mg of para-toluenesulfonic acid (manufactured by Wako Pure Chemical Industries, Ltd.) was added with stirring to start a reaction. While the temperature of the mixture was raised to 190° C., 380 g of the acetal bond-removed naphthalene formaldehyde resin obtained above (the number of moles of contained oxygen 1.2 mol) was added over 1 hour. Then, the mixture was further reacted for 3 hours.

The obtained reaction liquid was diluted with 1000 g of a mixed solvent (meta-xylene (manufactured by MITSUBISHI GAS CHEMICAL COMPANY, INC.)/methyl isobutyl ketone (manufactured by Wako Pure Chemical Industries, Ltd.)=1/1 (mass ratio)) and then neutralized and water-washed, and the solvent and the unreacted raw materials were removed under reduced pressure to obtain 530 g of a phenol-modified naphthalene formaldehyde resin, a blackish brown solid, represented by the following formula (9b). The OH value of the obtained phenol-modified naphthalene formaldehyde resin was 193 mg KOH/g (the OH group equivalent was 290 g/eq.).

(9b)

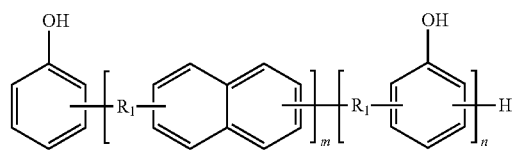

wherein $R_1$, m, and n have the same meanings as described in the above-described formula (9).

<Synthesis of NRCN>

526 g of the phenol-modified naphthalene formaldehyde resin represented by formula (9b) obtained by the above method (OH group equivalent 290 g/eq.) (1.81 mol in terms of OH groups) (weight average molecular weight Mw 700) and 275.5 g (2.72 mol) (1.5 mol based on 1 mol of hydroxy groups) of triethylamine were dissolved in 2943 g of dichloromethane, and this solution was a solution 1.

While 178.5 g (2.90 mol) (1.6 mol based on 1 mol of hydroxy groups) of cyanogen chloride, 416.5 g of dichloromethane, 275.7 g (2.72 mol) (1.5 mol based on 1 mol of hydroxy groups) of 36% hydrochloric acid, and 1710 g of water were maintained at a liquid temperature of –2 to –0.5° C. under stirring, the solution 1 was poured over 55 minutes. After the completion of the pouring of the solution 1, the mixture was stirred at the same temperature for 30 minutes, and then a solution of 110.2 g (1.09 mol) (0.6 mol based on 1 mol of hydroxy groups) of triethylamine dissolved in 110.2 g of dichloromethane (solution 2) was poured over 13 minutes. After the completion of the pouring of the solution 2, the mixture was stirred at the same temperature for 30 minutes to complete the reaction.

Then, the reaction liquid was left at rest to separate the organic phase and the aqueous phase. The obtained organic phase was washed four times with 2000 g of water. The electrical conductivity of the wastewater from the fourth water washing was 15 μS/cm, and it was confirmed that removable ionic compounds were sufficiently removed by the washing with water.

The organic phase after the water washing was concentrated under reduced pressure and finally concentrated to dryness at 90° C. for 1 hour to obtain 556 g of the target cyanate ester compound NRCN (light yellow viscous material). The weight average molecular weight Mw of the obtained cyanate ester compound NRCN was 1000. A GPC chart is shown in FIG. 3. In addition, the IR spectrum of the NRCN showed absorption at 2250 cm$^{-1}$ (cyanate ester groups) and showed no absorption of hydroxy groups. An IR chart is shown in FIG. 4. It was possible to dissolve 50% by mass or more of the NRCN in methyl ethyl ethyl ketone at 25° C.

Example 4

A hardened product was obtained as in Example 2 except that in Example 2, 100 parts by mass of the NRCN obtained in Example 3 was used instead of using 100 parts by mass of the NMCN.

(Example 5) Synthesis of Cyanate Ester Compound of Naphthol-Modified Naphthalene Formaldehyde Resin (Cyanate Ester Compound of Following Formula (1c) (Having Following Formula (29) as Typical Compositions): Hereinafter Also Abbreviated as "NMNCN")

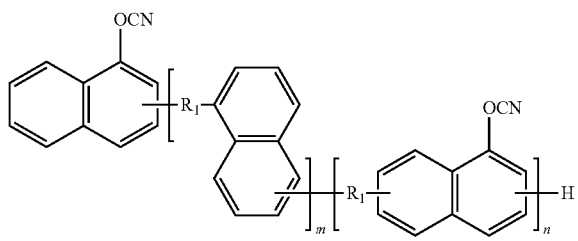

wherein $R_1$, m, and n have the same meanings as described in the above-described formula (1).

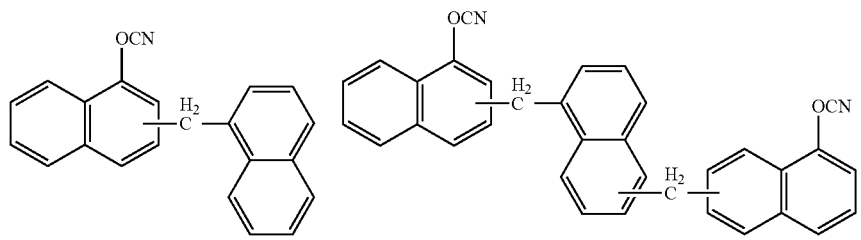

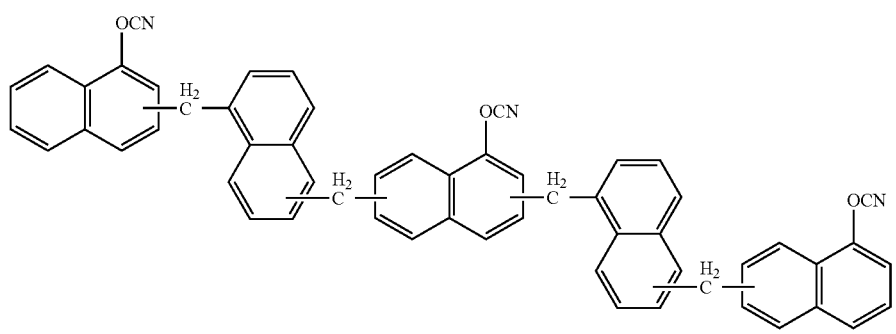

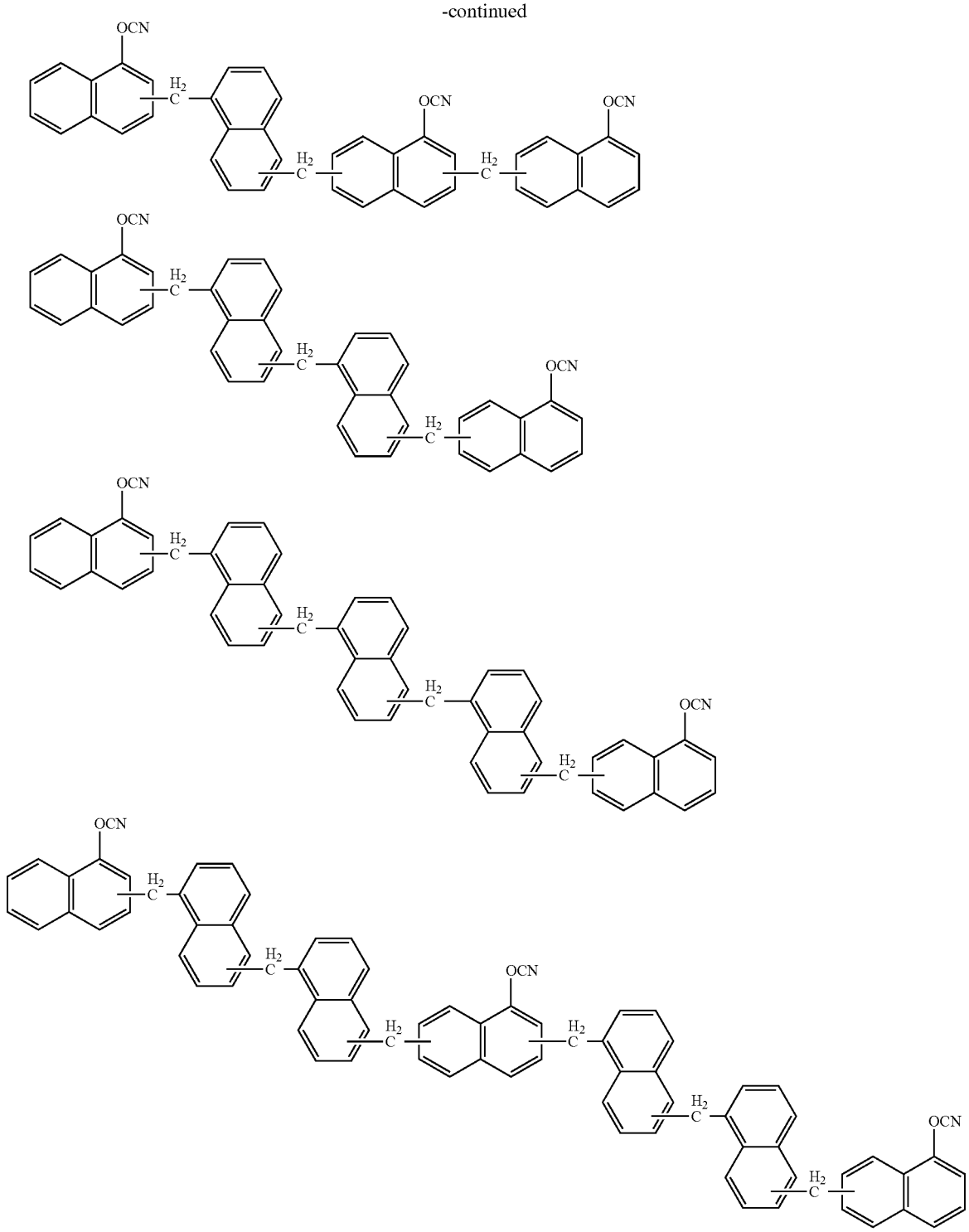

<Synthesis of Naphthalene Formaldehyde Resin>

1277 g of a 37% by mass aqueous solution of formalin (15.8 mol of formaldehyde, manufactured by MITSUBISHI GAS CHEMICAL COMPANY, INC.) and 634 g of 98% by mass sulfuric acid (manufactured by MITSUBISHI GAS CHEMICAL COMPANY, INC.) were stirred under reflux under normal pressure around 100° C. 553 g of molten 1-naphthalenemethanol (3.5 mol, manufactured by MITSUBISHI GAS CHEMICAL COMPANY, INC.) was dropped thereinto over 4 hours, and then the mixture was further reacted for 2 hours. 500 g ethylbenzene (manufactured by Wako Pure Chemical Industries, Ltd.) and 500 g of methyl isobutyl ketone (manufactured by Wako Pure Chemical Industries, Ltd.) as diluent solvents were added to the obtained reaction liquid, and the reaction liquid was left at rest. Then, the aqueous phase, the lower phase, was removed. Further, the reaction liquid was neutralized and water-washed, and the ethylbenzene and the methyl isobutyl ketone were distilled off under reduced pressure to obtain 624 g of a naphthalene formaldehyde resin, a pale yellow solid.

<Synthesis of Naphthol-Modified Naphthalene Formaldehyde Resin>

500 g of the naphthalene formaldehyde resin obtained above (the number of moles of contained oxygen 3.9 mol) and 1395 g of naphthol (9.7 mol, manufactured by SUGAI CHEMICAL IND. CO., LTD) were heated and melted at 100° C., and then 200 mg of para-toluenesulfonic acid (manufactured by Wako Pure Chemical Industries, Ltd.) was added with stirring to start a reaction. While the temperature was raised to 170° C., the mixture was reacted for 2.5 hours. Then, the obtained reaction liquid was diluted with 2500 g of a mixed solvent (meta-xylene (manufactured by MITSUBISHI GAS CHEMICAL COMPANY, INC.)/methyl isobutyl ketone (manufactured by Wako Pure Chemical Industries, Ltd.)=1/1 (mass ratio)) and then neutralized and water-washed, and the solvent and the unreacted raw materials were removed under reduced pressure to obtain 1125 g of a naphthol-modified naphthalene formaldehyde resin, a blackish brown solid, represented by the following formula (9c). The OH value of the obtained naphthol-modified naphthalene formaldehyde resin was 232 mg KOH/g (the OH group equivalent was 241 g/eq.).

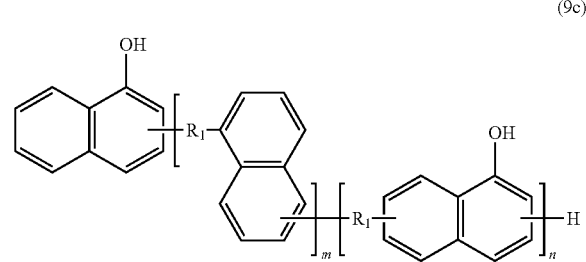

(9c)

wherein $R_1$, m, and n have the same meanings as described in the above-described formula (9).

<Synthesis of NMNCN>

730 g of the naphthol-modified naphthalene formaldehyde resin represented by formula (9c) obtained by the above method (OH group equivalent 241 g/eq.) (3.03 mol in terms of OH groups) (weight average molecular weight Mw 390) and 459.8 g (4.54 mol) (1.5 mol based on 1 mol of hydroxy groups) of triethylamine were dissolved in 4041 g of dichloromethane, and this solution was a solution 1.

While 298.4 g (4.85 mol) (1.6 mol based on 1 mol of hydroxy groups) of cyanogen chloride, 661.6 g of dichloromethane, 460.2 g (4.54 mol) (1.5 mol based on 1 mol of hydroxy groups) of 36% hydrochloric acid, and 2853.2 g of water were maintained at a liquid temperature of −2 to −0.5° C. under stirring, the solution 1 was poured over 72 minutes. After the completion of the pouring of the solution 1, the mixture was stirred at the same temperature for 30 minutes, and then a solution of 183.9 g (1.82 mol) (0.6 mol based on 1 mol of hydroxy groups) of triethylamine dissolved in 184 g of dichloromethane (solution 2) was poured over 25 minutes. After the completion of the pouring of the solution 2, the mixture was stirred at the same temperature for 30 minutes to complete the reaction.

Then, the reaction liquid was left at rest to separate the organic phase and the aqueous phase. The obtained organic phase was washed five times with 2000 g of water. The electrical conductivity of the wastewater from the fifth water washing was 20 μS/cm, and it was confirmed that removable ionic compounds were sufficiently removed by the washing with water.

The organic phase after the water washing was concentrated under reduced pressure and finally concentrated to dryness at 90° C. for 1 hour to obtain 797 g of the target cyanate ester compound NMNCN (brown viscous material).

The weight average molecular weight Mw of the obtained cyanate ester compound NMNCN was 490. A GPC chart is shown in FIG. 5. In addition, the IR spectrum of the NMNCN showed absorption at 2260 $cm^{-1}$ (cyanate ester groups) and showed no absorption of hydroxy groups. An IR chart is shown in FIG. 6. It was possible to dissolve 50% by mass or more of the NMNCN in methyl ethyl ethyl ketone at 25° C.

Example 6

A hardened product was obtained as in Example 2 except that in Example 2, 100 parts by mass of the NMNCN obtained in Example 5 was used instead of using 100 parts by mass of the NMCN.

Comparative Example 1

A hardened product was obtained as in Example 2 except that in Example 2, 100 parts by mass of 2,2-bis(4-cyanatophenyl)propane (trade name skylex manufactured by MITSUBISHI GAS CHEMICAL COMPANY, INC.) was used instead of using 100 parts by mass of the NMCN. It was possible to dissolve 50% by mass or more of the 2,2-bis(4-cyanatophenyl)propane skylex in methyl ethyl ethyl ketone at 25° C.

The characteristics of the hardened products obtained as described above were evaluated by the following methods.

Coefficiency of thermal expansion: Thermomechanical analysis in an expansion and compression mode was carried out in accordance with JIS-K-7197-2012 (JIS C6481) using a thermomechanical analysis apparatus (TMA/SS6100 manufactured by SII NanoTechnology Inc.) with a test piece of 5 mm×5 mm×1.5 mm, a start temperature of 30° C., an end temperature of 330° C., a temperature rise rate of 10° C./min, and a weighting of 0.05 N (49 mN), and the amount of average thermal expansion per ° C. from 60 to 120° C. was measured.

Mass reduction percentage (%): The mass was measured in accordance with JIS-K7120-1987 using a differential thermal-thermal mass simultaneous measurement apparatus (TG/DTA6200 manufactured by SII NanoTechnology Inc.) with a test piece of 3 mm×3 mm×1.5 mm, a start temperature of 30° C., an end temperature of 500° C., and a temperature rise rate of 10° C./min and under a nitrogen atmosphere, and the mass reduction percentage at 450° C. was calculated based on the following formula:

mass reduction percentage (%)=$(D-E)/I$×100

D represents the mass at the start temperature, and E represents the mass at 450° C.

Here, the flame retardancy was evaluated as better as the amount of the residue during pyrolysis becomes larger, that is, the mass reduction percentage becomes lower.

The evaluation results are shown in Table 1.

TABLE 1

|  |  |  | Example 2 | Example 4 | Example 6 | Comparative Example 1 |
|---|---|---|---|---|---|---|
| Blend | NMCN | Parts by mass | 100 | 0 | 0 | 0 |
|  | NRCN |  | 0 | 100 | 0 | 0 |
|  | NMNCN |  | 0 | 0 | 100 | 0 |
|  | 2,2-Bis(4-cyanatophenyl)propane |  | 0 | 0 | 0 | 100 |
|  | Zinc octylate |  | 0.05 | 0.05 | 0.05 | 0.05 |
| Monomer properties | solubility | % by mass | >50 | >50 | >50 | >50 |
| Hardened product properties | Coefficiency of thermal expansion | ppm/° C. | 48 | 50 | 42 | 53 |
|  | Mass reduction percentage | % | 19 | 23 | 30 | 30 |

As is also clear from Table 1, it was confirmed that the cyanate ester compounds obtained in these Examples had excellent solvent solubility and also excellent handling properties. In addition, it was confirmed that the hardened products using the cyanate ester compounds of the curable resin composition obtained in these Examples had a lower coefficiency of thermal expansion and better flame retardancy than when using a cyanated product that was a conventional product.

The invention claimed is:

1. A cyanate ester compound obtained by cyanating a modified naphthalene formaldehyde resin, wherein the cyanate ester compound has a structure represented by the following formula (1):

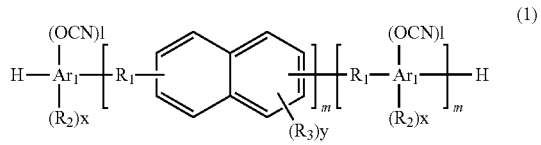

wherein $Ar_1$ represents an aromatic ring;

$R_1$ each independently represents a methylene group, a methyleneoxy group, a methyleneoxymethylene group, or an oxymethylene group, and the methylene group, the methyleneoxy group, the methyleneoxymethylene group, and the oxymethylene group may be linked;

$R_2$ represents a monovalent substituent and each independently represents a hydrogen atom, an alkyl group, or an aryl group;

$R_3$ each independently represents a hydrogen atom, an alkyl group having 1 to 3 carbon atoms, an aryl group, a hydroxy group, or a hydroxymethylene group;

m represents an integer of 1 or more, and n represents an integer of 0 or more;

wherein m and n are not the same;

arrangement of repeating units is arbitrary;

l represents a number of bonded cyanato groups and is an integer of 1 to 3;

x represents a number of bonded $R_2$ and is "a number of possible bonds of $Ar_1$-(1+2)"; and y represents an integer of 0 to 4.

2. The cyanate ester compound according to claim 1, wherein the modified naphthalene formaldehyde resin is obtained by modifying a naphthalene formaldehyde resin or an acetal bond-removed naphthalene formaldehyde resin using a hydroxy-substituted aromatic compound.

3. The cyanate ester compound according to claim 2, wherein the hydroxy-substituted aromatic compound is at least one selected from the group consisting of phenol, 2,6-xylenol, naphthol, dihydroxynaphthalene, biphenol, hydroxyanthracene, and dihydroxyanthracene.

4. The cyanate ester compound according to claim 1, having a weight average molecular weight Mw of 200 to 25000.

5. A curable resin composition comprising the cyanate ester compound according to claim 1.

6. The curable resin composition according to claim 5, further comprising at least one other cyanate ester compound selected from the group consisting of an epoxy resin, an oxetane resin, and a compound having a polymerizable unsaturated group.

7. A sealing material comprising the curable resin composition according to claim 5.

8. A fiber-reinforced composite material comprising the curable resin composition according to claim 5.

9. An adhesive comprising the curable resin composition according to claim 5.

* * * * *